(12) United States Patent
Ishihara et al.

(10) Patent No.: US 8,399,980 B2
(45) Date of Patent: Mar. 19, 2013

(54) ELECTRONIC COMPONENT USED FOR WIRING AND METHOD FOR MANUFACTURING THE SAME

(75) Inventors: Masamichi Ishihara, Kitakyushu (JP); Hirotaka Ueda, Yokohama (JP)

(73) Assignee: Kyushu Institute of Technology, Fukuoka (JP)

( * ) Notice: Subject to any disclaimer, the term of this patent is extended or adjusted under 35 U.S.C. 154(b) by 106 days.

(21) Appl. No.: 12/935,341

(22) PCT Filed: Mar. 27, 2009

(86) PCT No.: PCT/JP2009/056273
§ 371 (c)(1),
(2), (4) Date: Sep. 29, 2010

(87) PCT Pub. No.: WO2009/123048
PCT Pub. Date: Oct. 8, 2009

(65) Prior Publication Data
US 2011/0012269 A1  Jan. 20, 2011

(30) Foreign Application Priority Data
Mar. 31, 2008  (JP) .................. 2008-90189

(51) Int. Cl.
*H01L 23/48* (2006.01)
*H01L 23/053* (2006.01)
*H01L 23/52* (2006.01)
*H01L 21/44* (2006.01)
*H01L 21/48* (2006.01)
*H01L 21/50* (2006.01)

(52) U.S. Cl. . 257/693; 257/701; 257/737; 257/E21.237; 438/108; 438/127; 438/118; 438/124

(58) Field of Classification Search .................. 257/687, 257/678, 701, 737, 693, 700, E23.178, E21.237; 438/108, 118, 124, 127, 612, 666
See application file for complete search history.

(56) References Cited

U.S. PATENT DOCUMENTS

| | | | |
|---|---|---|---|
| 5,239,448 A * | 8/1993 | Perkins et al. | 361/764 |
| 6,919,226 B2 * | 7/2005 | Ogawa et al. | 438/108 |
| 2003/0090883 A1 * | 5/2003 | Asahi et al. | 361/761 |
| 2005/0001331 A1 * | 1/2005 | Kojima et al. | 257/778 |
| 2006/0121718 A1 * | 6/2006 | Machida et al. | 438/612 |
| 2007/0022590 A1 * | 2/2007 | Hirano et al. | 29/25.03 |
| 2007/0231962 A1 * | 10/2007 | Fujii | 438/107 |
| 2009/0050994 A1 | 2/2009 | Ishihara et al. | |

FOREIGN PATENT DOCUMENTS

| | | |
|---|---|---|
| JP | 2001-127243 | 5/2001 |
| JP | 2002-359350 | 12/2002 |
| JP | 2008-016729 | 1/2008 |
| JP | WO 2008/065896 | 6/2008 |
| JP | 2009-070882 | 4/2009 |

* cited by examiner

*Primary Examiner* — Shouxiang Hu
(74) *Attorney, Agent, or Firm* — McGlew and Tuttle, P.C.

(57) ABSTRACT

A wiring electronic component of the present invention is incorporated into an electronic device package in which a circuit element including a semiconductor chip is disposed and in which the circuit element is connected to a wiring pattern on the back face and also connected, via vertical wiring, to external electrodes located on the front face opposite the wiring pattern. The wiring electronic component is composed of an electrically conductive support portion, which serves as an electroforming mother die, and a plurality of vertical wiring portions formed through electroforming such that they are integrally connected to the support portion.

18 Claims, 24 Drawing Sheets

FIRST EXAMPLE OF WIRING ELECTRONIC COMPONENT

SECOND EXAMPLE OF WIRING ELECTRONIC COMPONENT

ENLARGED VIEW OF SINGLE CHIP

X-X' CROSS-SECTIONAL VIEW

THIRD EXAMPLE OF WIRING ELECTRONIC COMPONENT

UNIT STRUCTURE

CONNECTED STRUCTURE

FOURTH EXAMPLE OF WIRING ELECTRONIC COMPONENT

Y-Y' CROSS-SECTIONAL VIEW

FIFTH EXAMPLE OF WIRING ELECTRONIC COMPONENT

Z-Z' CROSS-SECTIONAL VIEW

SILICON SUBSTRATE (OR GLASS) SEPARATED

HORIZONTAL WIRING PORTION

BUMP ELECTRODE (a) APPLICATION OF RESIST

PHOTORESIST
MOTHER DIE (b) PATTERNING

PHOTORESIST PATTERN (c) PLATING

PLATING METAL (d) FLATTENING

FLAT SURFACE (e) REMOVAL OF RESIST

RESIST REMOVAL (f) SEPARATION

WIRING PORTION

US 8,399,980 B2

ELECTRONIC COMPONENT USED FOR WIRING AND METHOD FOR MANUFACTURING THE SAME

TECHNICAL FIELD

The present invention relates to an electronic component used for wiring (hereinafter referred to as a "wiring electronic component") to be incorporated into an electronic device package in which a circuit element including a semiconductor chip is disposed and which has external electrodes connected to the circuit element via vertical wiring, and to a method of manufacturing the same.

BACKGROUND ART

In association with an increase in the degree of integration of LSI chips, there has been strong demand for a reduction in package size. Under these circumstances, various package structures have been proposed. In recent years, developments have been carried out intensively for stacking semiconductor bare chips in which through electrodes are formed and which have a double-sided electrode structure. This technique requires a through electrode structure (see Patent Document 1). However, the presently employed method of forming through electrodes requires complicated steps, including formation of openings of a silicon substrate, formation of insulation film covering the wall surfaces of the openings, and charge of low-resistance metal. As described above, the method of forming through electrodes in a semiconductor substrate and providing insulation therefor still involves problems to be solved, and there has been demand for a technique which enables formation of a double-sided electrode structure without requiring through electrodes. Meanwhile, in association with further evolution of cellular phones and digital cameras, product application of a wafer level chip size package (WLCSP), which is an electronic device package of real size, tends to be expanded further in future.

Although Patent Document 1 discloses a double-sided electrode structure in which projection electrodes are formed on a substrate, it does not contain specific disclosure regarding a method of forming the projection electrodes and a method of establishing connection. Although Patent Document 1 also discloses rewiring on the upper surface, it discloses only a conventional method for formation of rewiring in which film of low-resistance metal is formed on the upper surface through plating and is patterned by use of lithography. Therefore, the method disclosed in the document has a big problem in terms of cost.

In general, a semiconductor manufacturing process is divided into a former stage for fabricating an LSI and a latter stage for packaging the LSI. There are a few manufacturers that specialize in the latter stage but can cover the former stage. Manufacture of conventional electronic device packages, such as wafer level chip size package (WLCSP), requires a process of performing rewiring, plating of vertical wiring portions, etc. on a wafer; that is, requires facilities similar to those used in the former stage, and cannot be performed by use of only conventional facilities for the latter stage.

Patent Document 1: Japanese Patent Application Laid-Open (kokai) No. 2001-127243

DISCLOSURE OF THE INVENTION

Problems to be Solved by the Invention

In the case where electrodes are provided on a side opposite a LSI-chip-carrying substrate to be separated from the substrate (as in the case of a dual face package (hereinafter abbreviated to "DFP")) or in the case where electrodes are provided on a side opposite an LSI chip to be separated from an active face of the chip (as in the case of a wafer level chip size package (hereinafter abbreviated to "WLCSP")), a structure is needed which includes at least vertical wiring for establishing connection between a substrate and electrodes separated therefrom, or horizontal wiring for rewiring. In general, vertical wiring of a DFP is formed through employment of a structure in which vertical wiring is previously formed in a substrate, a method of forming openings in resin after performance of resin sealing and filling the openings with plating, or a structure in which electrodes extend through a silicon substrate such that the electrodes are exposed on opposite faces thereof. Furthermore, rewiring is formed by use of the ink jet technique or lithography. As described above, conventional techniques for forming vertical wiring and/or rewiring require complex processes and high cost.

The present invention has been accomplished so as to solve the above-described problems. An object of the present invention is to enable additional processes required for formation of a DFP or WLCSP structure to be implemented through use of a component for vertical wiring and/or rewiring, to thereby simplify the process and reduce cost by outsourcing the component to a dedicated manufacturer. Through replacement of the vertical wiring and/or rewiring forming processes with a component, in the case of WLCSP or the like, it becomes possible to put together off line, in the form of a component, processes which require facilities similar to those used in the former stage, to thereby enable manufacturers dedicated for the latter stage to enter into manufacture of such packages without large investment. Furthermore, use of vertical wiring enables the DFP structure to be fabricated simply at low cost without requiring a through-electrode technique or the like. As a result, various electronic device packages of small size and high density, such as DFP and WLCSP, can be readily supplied.

Means for Solving the Problems

The present invention provides a wiring electronic component to be incorporated into an electronic device package in which a circuit element including a semiconductor chip is disposed and is connected, via vertical wiring, to external electrodes located on the front face thereof. The present invention also provides a method of manufacturing such a wiring electronic component. The wiring electronic component is composed of an electrically conductive support portion, which serves as an electroforming mother die, and a plurality of vertical wiring portions formed through electroforming such that they are integrally connected to the support portion. On the support portion, not only the vertical wiring portions supported thereby, but also horizontal wiring portions connected to the vertical wiring portions can be formed.

Alternatively, the wiring electronic component is composed of a support portion, which is formed of an insulation material or which has a two-layer structure in which a reinforcement plate is bonded to the back side of the insulation material via a separation assisting layer, and a plurality of vertical wiring portions formed through plating such that they are integrally connected to the support portion. On the support portion, not only the vertical wiring portions supported thereby, but also horizontal wiring portions connected to the vertical wiring portions can be formed. For example, the support portion is composed of a reinforcement plate, such as a silicon substrate, a glass substrate, or a stainless steel plate, and a tape which is bonded to the entirety of one side of the reinforcement plate and which is formed of an insulation material in the form of thin film. A seed layer for plating is formed on the insulation material, and the vertical wiring portions and the horizontal wiring portions are grown on the seed layer through plating. Alternatively, a copper-foil-clad tape is bonded to the reinforcement plate, the copper foil is machined to form horizontal wiring, and vertical wiring is formed on the horizontal wiring through plating.

Alternatively, the wiring electronic component is composed of an electrically conductive or insulative support portion, and a plurality of vertical wiring portions which are integrally connected to the support portion so as to form the vertical wiring. The vertical wiring portions are formed through a process of forming holes for the vertical wiring portions in a layer of photoresist applied to the support portion, and charging an electrically conductive paste into the holes.

Effects of the Invention

For example, in the case of WLCSPs, the present invention enables processes which require facilities used in the former stage to be put together in the form of a component off line, and enables manufacturers dedicated for the latter stage to enter production of WLCSPs without large investment and to readily cope with a future expansion of the market. Also, since new introduction of expensive facilities and plating facilities is not required, costs can be lowered.

Furthermore, according to the present invention, wiring electronic component can be manufactured simply at lower cost without requiring a through electrode technique for forming DFPs. Therefore, the wiring electronic component of the present invention is effective in the field of compact packaging for electronic equipment such as cellular phones and in the field of sensor packages whose three-dimensional connection is effective in electronic equipment.

BRIEF DESCRIPTION OF THE DRAWINGS

FIGS. 1(A) to 1(C) are views showing a first example of a wiring electronic component which embodies the present invention, wherein FIGS. 1(A) and 1(B) show a side cross-sectional view and a perspective view, respectively, of a unit structure for a single electronic device package, and FIG. 1(C) shows a perspective view of a structure in which four unit structures for four electronic device packages are connected together.

FIGS. 7(A) and 7(B) are views showing a second example of a wiring electronic component which embodies the present invention, wherein FIGS. 7(A) and 7(B) are show a side cross-sectional view and a perspective view, respectively, of a unit structure.

FIGS. 17(A) to 17(C) are views showing a completed LSI wafer, wherein FIG. 17(A) shows a single wafer on which a plurality of chips are formed in a matrix pattern, FIG. 17(B) is an elongated LSI chip perspective view showing one chip extracted from FIG. 17(A), and FIG. 17(C) is a cross-sectional view taken along line X-X'.

FIGS. 22(A) to 22(C) are views showing a third example of the wiring electronic component which embodies the present invention, wherein FIGS. 22(A) and 22(B) show a side cross-sectional view and a perspective view, respectively, of a unit structure, and FIG. 22(C) shows a perspective view of a structure in which four unit structures are connected together.

FIGS. 27(A) and 27(B) are views showing a fourth example of the wiring electronic component which embodies the present invention, wherein FIG. 27(A) is a perspective view showing a plurality of wiring electronic components connected together, and FIG. 27(B) is a cross-sectional view taken along line Y-Y' in FIG. 27(A).

FIGS. 32(A) and 32(B) are views showing a fifth example of the wiring electronic component which embodies the present invention, wherein FIG. 32(A) is a perspective view showing a plurality of wiring electronic components connected together, and FIG. 32(B) is a cross-sectional view taken along line Z-Z' in FIG. 32(A).

BEST MODE FOR CARRYING OUT THE INVENTION

Figure 1A:
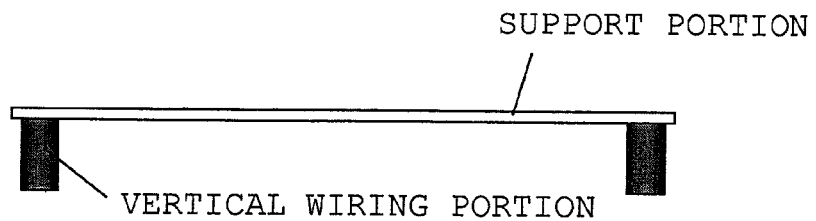
Figure 1B:
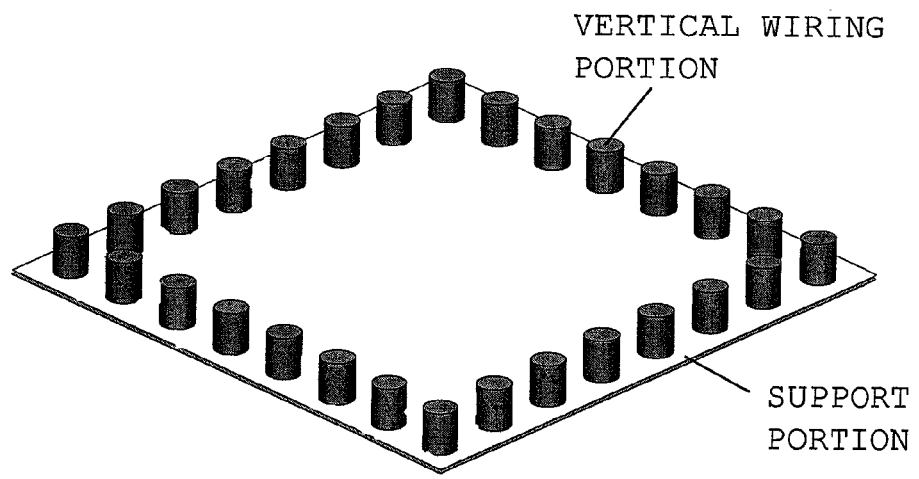
Figure 1C:
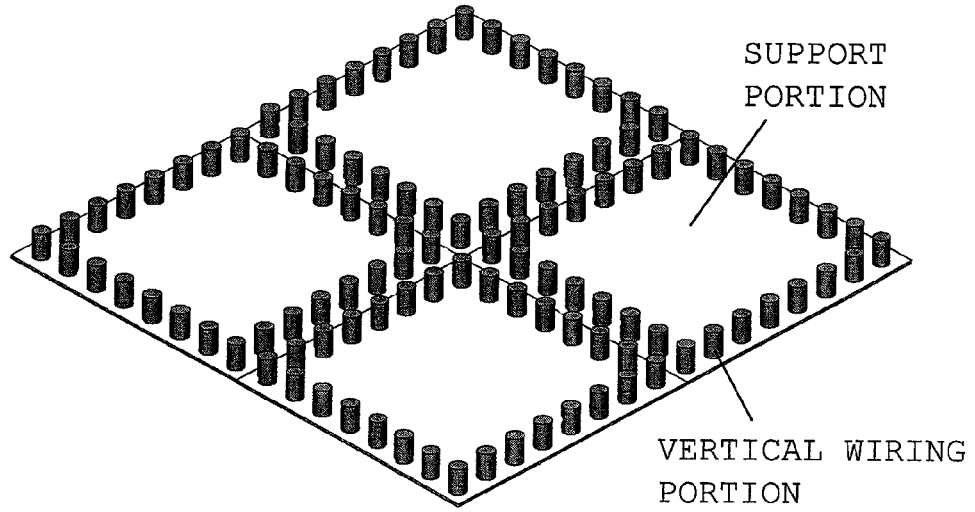

The present invention will now be described by way of example. FIGS. 1(A) to 1(C) are views showing a first example of a wiring electronic component which embodies the present invention, wherein FIGS. 1(A) and 1(B) show a side cross-sectional view and a perspective view, respectively, of a unit structure for a single electronic device package, and FIG. 1(C) shows a perspective view of a structure in which four unit structures for four electronic device packages are connected together. In this first example of the wiring electronic component, a plurality of vertical wiring portions are formed through electroforming such that they are connected together by a support portion formed of an electrically conductive material. The shape of the vertical wiring portions is not limited to the illustrated circular columnar shape, and the vertical wiring portions may have any of other columnar (bar-like) shapes such as a rectangular columnar shape and a polygonal columnar shape. In the illustrated example, the central plate-shaped portion of the structure has no cutout; however, the central plate-shaped portion may have a cutout. The integrally connected vertical wiring portions are manufactured through electroforming.

Electroforming itself is well known. Electroforming is a "method of manufacturing, repairing, or replicating a metal product through electroplating," and is basically the same as electroplating. However, electroforming differs from electroplating in plating thickness, and also differs from electroplating in that an operation of separating a plating film is performed. Further, when a plating film is separated from a mother die and used, control and management of the physical properties of the plating film are important. A material including nickel, copper, a nickel alloy, or a copper alloy can be used in the present invention as a plating metal (conductive material) to be deposited by electroforming. Stainless steel, which is generally used as an electrically conductive material, can be used as the material of the mother die used in the present invention. Alternatively, the mother die may be formed of a silicon substrate which serves as a base and whose surface is covered with a thin oxide film or the like which allows passage of electricity for plating therethrough and which facilitates separation of a plating pattern. The composition of a plating bath and plating conditions must be selected such that no internal stress is produced. In the case of nickel plating, nickel sulfamate bath is used as a plating bath.

Figure 42:
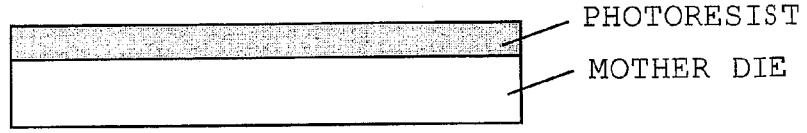
FIG. 42 is a set of process charts showing a method of manufacturing an electroformed component by use of photoresist.
Figure 42:
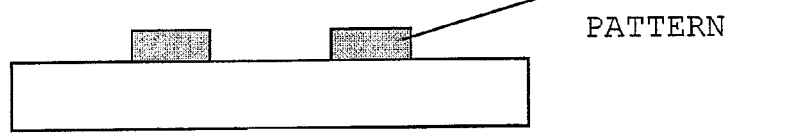
Figure 42:
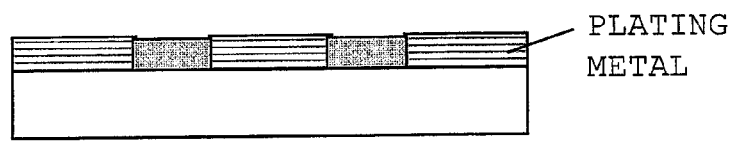
Figure 42:
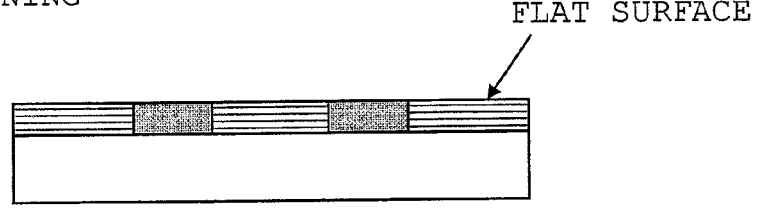
Figure 42:
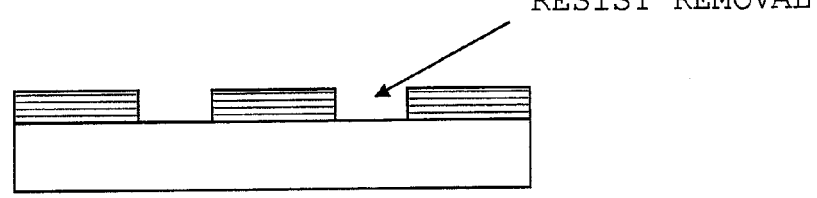
Figure 42:
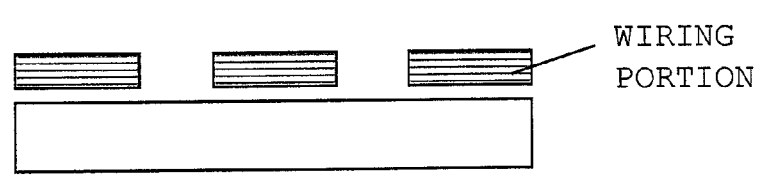

FIG. 42 is a set of process charts showing a method of manufacturing an electroformed component by use of photoresist. Although electroforming will be described below, the manufacturing steps shown in the process charts can be applied to plating. In the case of plating (electroless plating), in place of a conductor such stainless steel, an insulating member is used as a mother die, whereby the insulating member can be used as a protecting film of a semiconductor device without being removed.

Electroforming is performed as follows. As shown in FIG. 42(a), photoresist (non-conductive film) is applied to an upper surface of a mother die of, for example, stainless steel. Subsequently, the photoresist is exposed to light through a pattern film to thereby form a pattern, followed by development, whereby an original plate for electroforming is formed (FIG. 42(b)). In the original plate, non-plating portions are covered by the photoresist pattern. The photoresist pattern of the original plate for electroforming has a thickness greater than that of a product (the vertical wiring portions or horizontal wiring portions). In the case of the vertical wiring portions, the photoresist pattern has a thickness greater than the thickness of an IC chip; for example, a thickness of about 50 μm to 300 μm. Subsequently, a plating metal is deposited in opening portions of the photoresist pattern (FIG. 42(c)). An anode and a cathode are placed in a plating bath (e.g., nickel sulfamate solution) maintained at a proper temperature. The anode is formed of an electroforming metal to be deposited through electroforming. The cathode is an electroforming mother die of, for example, stainless steel. As shown in FIG. 42(c), a photoresist pattern is previously formed on the surface of the electroforming mother die serving as the cathode. When a current is caused to flow between the anode and the cathode, the electroforming metal of the anode melts, and is plated in the opening portions of the photoresist pattern on the electroforming mother die.

Next, as shown in FIG. 42(d), flattening machining is performed. Subsequently, the resist is removed (FIG. 42(e)), whereby the plating metal forms wiring portions such as horizontal wiring portions and vertical wiring portions. The wiring portions formed by the plating metal are then separated from the electroforming mother die (FIG. 42(f)). The feature of electroforming resides in that separation of the formed wiring portions and support portion can be readily performed by means of heat and pressure.

For manufacture of a wiring electronic component having horizontal wiring portions, which will be described later with reference to FIGS. 7(A) and 7(B), the steps shown in FIG. 42(a) to FIG. 42(d) are repeated two times. In the first step, horizontal wiring portions are formed on the support portion, and, in the second step, vertical wiring portions to be connected to the horizontal wiring portions are formed.

Figure 2:
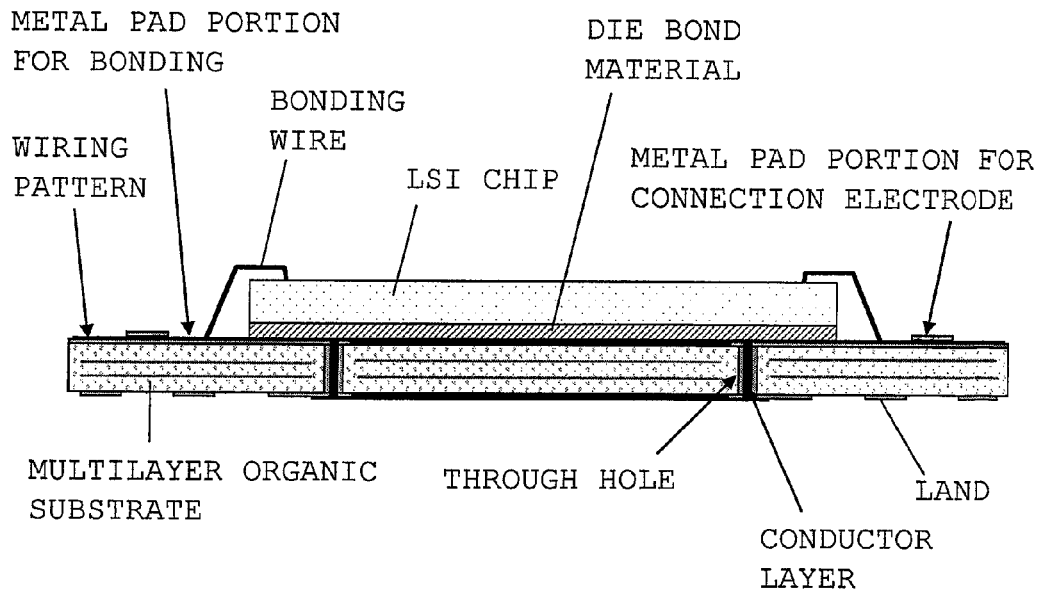
FIG. 2 is a view showing a state in which an LSI chip is bonded and connected to a multilayer organic substrate.

The wiring electronic component shown in FIG. 1 can be incorporated into various electronic device packages. A method of manufacturing an organic-substrate-type electronic device package which includes such a wiring electronic component will now be described, as an example, with reference to FIGS. 2 to 6. FIG. 2 is a view showing a state in which an LSI chip is bonded and connected to a multilayer organic substrate. FIG. 2 exemplifies a case where the LSI chip is bonded to the multilayer organic substrate by use of a die bond material, and is connected to a wiring pattern of the uppermost layer of the organic substrate by use of bonding wires. Metal pad portions for bonding, which serve as bonding wire connection electrodes, are formed on the wiring pattern of the uppermost layer of a multilayer or single-layer organic substrate, and wiring extending to the pad portions is formed. The metal pad portions on the front face of the multilayer or single-layer organic substrate and the LSI chip are connected together by means of Au bonding wires. Alternatively, the LSI chip can be flip-chip-bond connected to the organic substrate (not shown).

The single-layer organic substrate may have a single-layer, double-layer wiring structure, and the multilayer organic substrate may be formed by forming a wiring pattern on each of a plurality of layers, bonding these layers together, and optionally forming through holes for connecting the wiring patterns of the layers. Conductor layers are formed in the through holes, and connected to lands formed on the back face side and serving as end surface electrode portions. Such a multilayer or single-layer organic substrate is known as a batch-molded organic substrate (BGA: Ball Grid Array) in which small balls (bumps) made of a solder material, which are called "solder balls," are attached to the back face.

Figure 3:
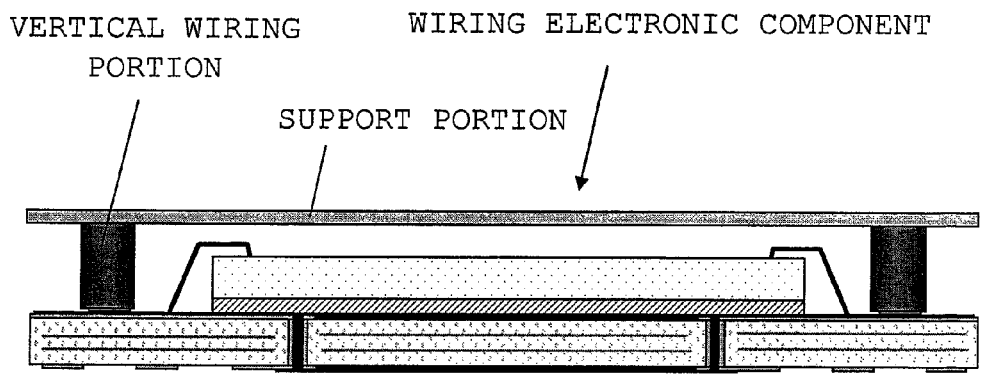
FIG. 3 is a view showing a state in which vertical wiring portions of the wiring electronic component shown in FIGS. 1A to 1C are fixed and connected to the multilayer organic substrate carrying an LSI chip bonded and connected thereto.

FIG. 3 is a view showing a state in which the vertical wiring portions of the wiring electronic component shown in FIGS. 1A to 1C are fixed and connected to the multilayer organic substrate carrying the LSI chip bonded and connected thereto. The vertical wiring portions are fixed to and electrically connected to the wiring pattern of the organic substrate at predetermined locations by means of, for example, soldering or electrically conductive paste such as silver paste. In a state where the vertical wiring portions have been fixed to metal pad portions for connection electrodes (FIG. 2) provided on the wiring pattern of the organic substrate at predetermined locations, all the vertical wiring portions are connected together by the plate-shaped support portion.

Figure 4:
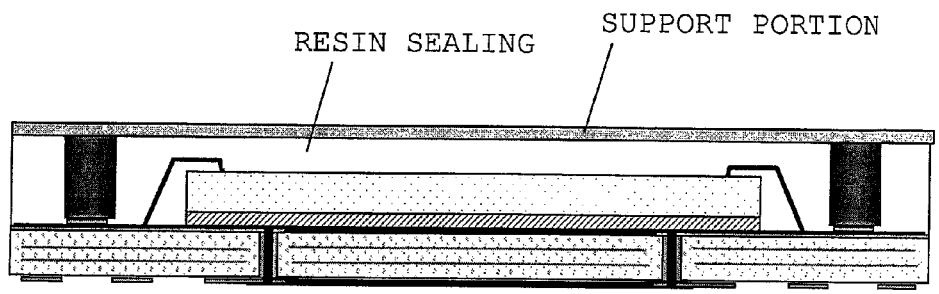
FIG. 4 is a view showing a state after performance of resin sealing.

FIG. 4 is a view showing a state after performance of resin sealing. After the vertical wiring portions connected together are fixed, in this state, the upper surface of the organic substrate is transfer-molded, or resin-sealed by use of a liquid resin (e.g., epoxy resin), up to the lower surface of the support portion.

Figure 5:
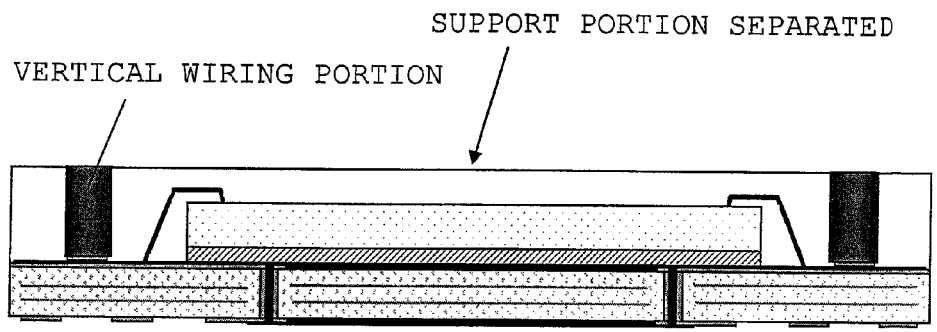
FIG. 5 is a view showing a state after separation of a support portion (electroforming mother die).
Figure 6:
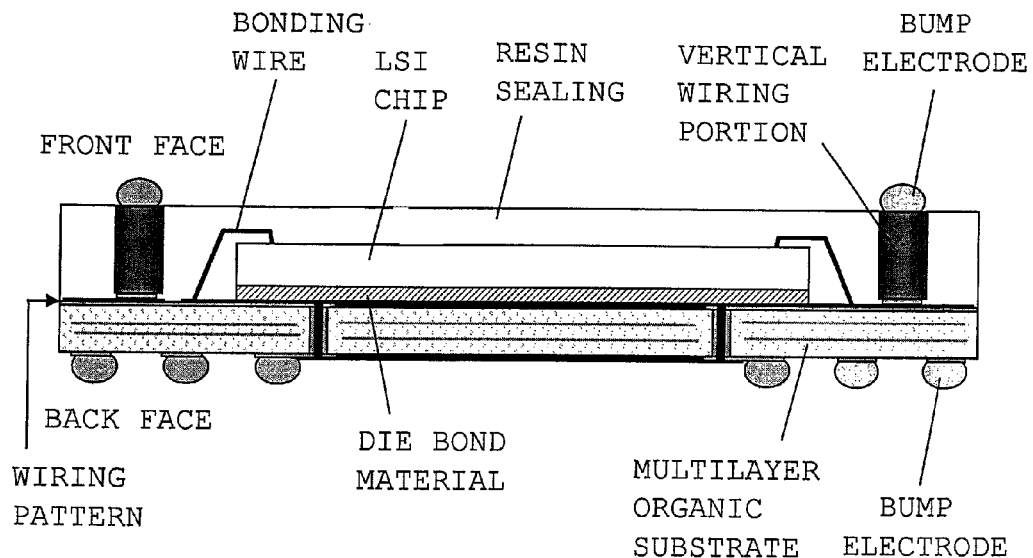
FIG. 6 is a view showing a completed state in which bump electrodes for external connection are formed on the front face side of vertical wiring portions and on end surface electrode portions (lands) formed on the back face side of the organic substrate.

FIG. 5 is a view showing a state after separation of a support portion (electroforming mother die). Upon removal of the support portion, the vertical wiring portions are electrically separated from one another. The structure obtained in this stage can be used as a completed product. However, as shown in FIG. 6, bump electrodes for external connection may be subsequently formed on the front face side of the vertical wiring portions and the end surface electrode portions (lands) which are formed on the back face side of the organic substrate. As described above, columnar vertical wiring portions are grown on the conductive material (the electroforming mother die), which serves as a support portion, by use of lithography and plating, whereby a wiring electronic component including a vertical wiring portion pattern integrated with the support portion is formed. This electronic component is connected to a multilayer substrate carrying an LSI chip, and a resin is charged into a space between the support portion and the multilayer substrate. After that, the support portion is removed, whereby an electronic device package having a double-sided electrode structure is formed such that the end surfaces of the vertical wiring portions are connected to bump electrodes. Thus, a circuit element which contains an LSI chip is connected, via the vertical wiring portions, to the bump electrodes (external terminals) located on the front face.

Figure 7A:
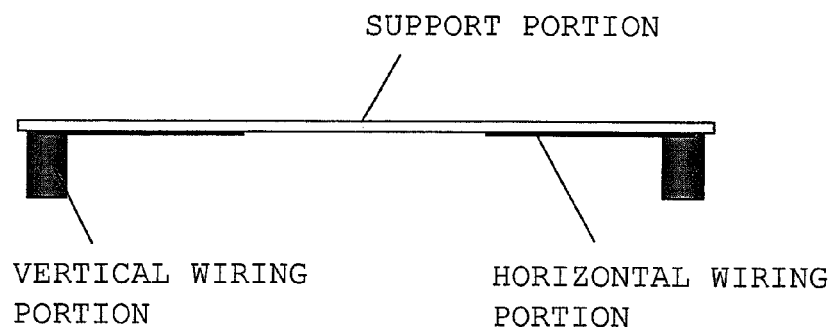
Figure 7B:
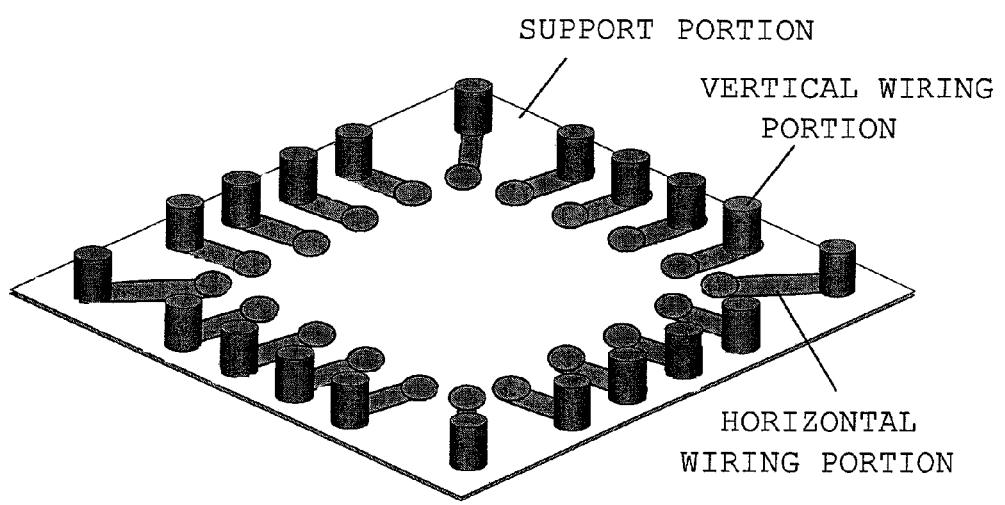

FIGS. 7A and 7B are views showing a second example of the wiring electronic component which embodies the present invention, wherein FIGS. 7(A) and 7(B) show a side cross-sectional view and a perspective view, respectively, of a unit structure. In this second example of the wiring electronic component, not only the vertical wiring portions supported by the support portion, but also horizontal wiring portion patterns to be connected thereto are formed by use of the above-described electroforming. Notably, although the wiring electronic component is illustrated as a unit structure, a structure in which a plurality of unit structures are connected together may be used as in the case shown in FIG. 1(C).

Like the above-described first example, the wiring electronic component of the second example shown in FIGS. 7(A) and 7(B) can be incorporated into various electronic device packages. A method of manufacturing an organic-substrate-type electronic device package which includes such a wiring electronic component will now be described, as an example, with reference to FIGS. 8 to 11.

Figure 8:
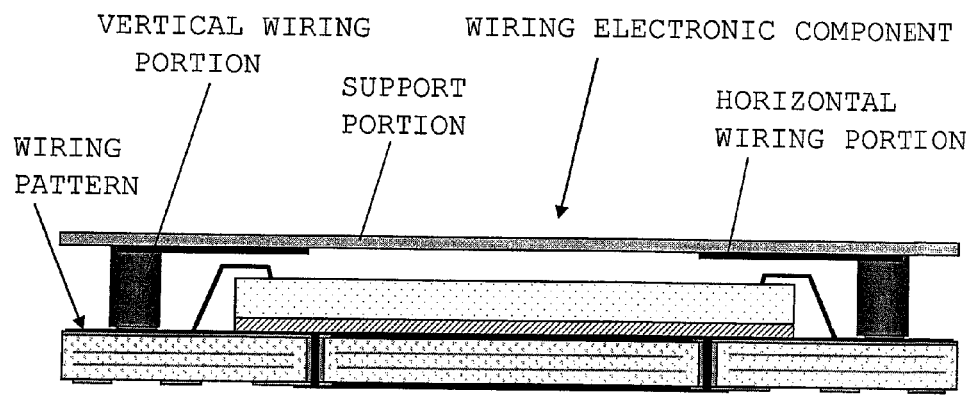
FIG. 8 is a view showing a state in which the wiring electronic component of the second example is fixed and connected to the multilayer organic substrate carrying an LSI chip bonded and connected thereto (see FIG. 2).

FIG. 8 is a view showing a state in which the wiring electronic component of the second example is fixed and connected to a multilayer organic substrate carrying an LSI chip bonded and connected thereto (see FIG. 2). As in the case described previously with reference to FIG. 3, the vertical wiring portions connected together by the plate-shaped support portion are fixed and electrically connected to a wiring pattern of the organic substrate at predetermined locations.

Figure 9:
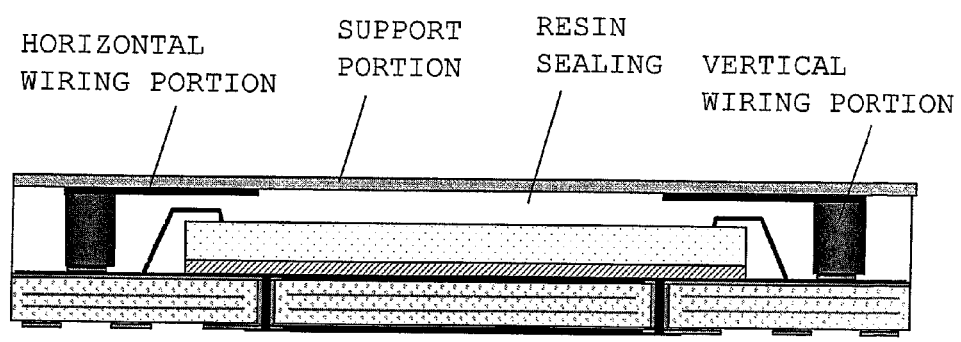
FIG. 9 is a view showing a state after performance of resin sealing.
Figure 10:
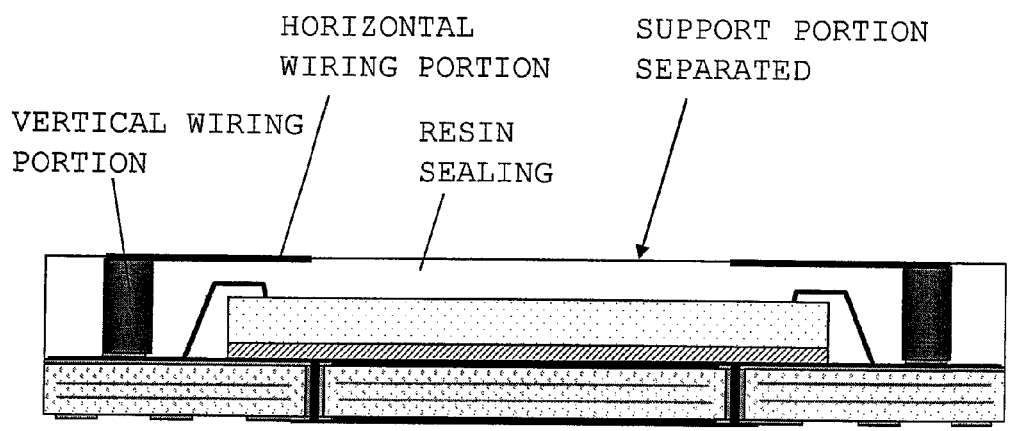
FIG. 10 is a view showing a state after separation of a support portion.
Figure 11:
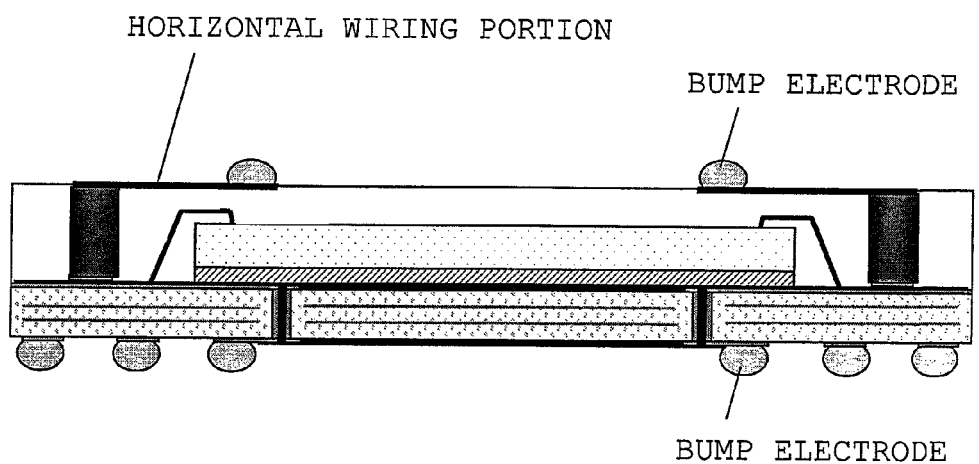
FIG. 11 is a view showing a completed state in which bump electrodes for external connection are formed at distal end portions of horizontal wiring portion patterns and on lands formed on the back face side of a multilayer organic substrate.

FIG. 9 is a view showing a state after performance of resin sealing. The resin sealing is performed as in the case described previously with reference to FIG. 4. Subsequently, the support portion is separated as shown in FIG. 10. FIG. 10 is a view showing a state after the support portion has been removed. Upon removal of the support portion, the vertical wiring portions and the horizontal wiring portion patterns connected thereto are electrically separated from one another. After that, as shown in FIG. 11, bump electrodes for external connection are formed at distal end portions of the horizontal wiring portion patterns and on lands formed on the back face side of the multilayer organic substrate. Furthermore, dicing is performed to obtain separated chips, which are completed products.

Figure 12:
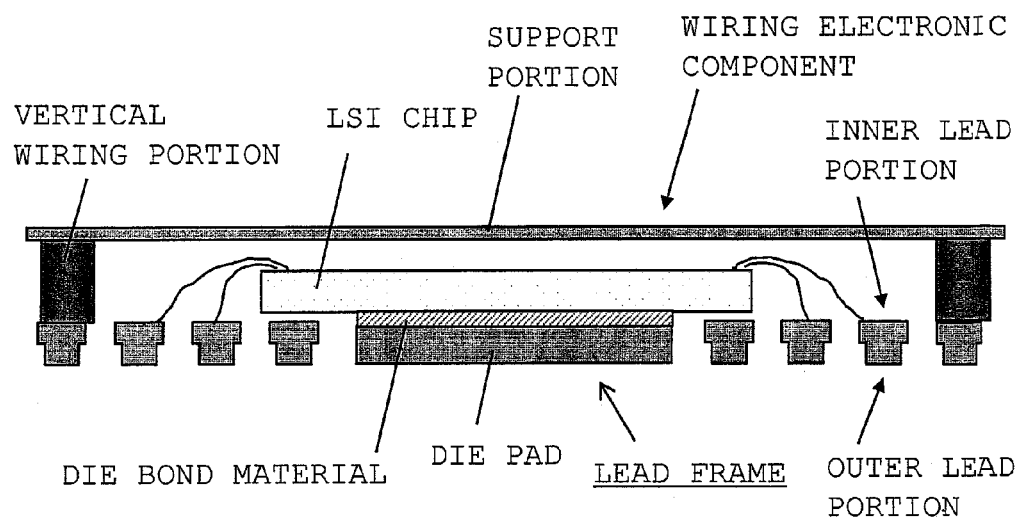
FIG. 12 is a view showing a state in which a wiring electronic component configured based on the present invention is fixed to and connected to a lead frame.

In the above, an example case where the first or second example of the wiring electronic component is used for manufacture of an organic-substrate-type electronic device package. However, the wiring electronic component of the present invention can be applied to other electronic device packages of various types other than the organic substrate type. FIG. 12 is a view showing a state in which a wiring electronic component configured based on the present invention is fixed to and connected to a lead frame. Notably, although the first example of the wiring electronic component shown in FIGS. 1(A) to 1(C) is used in FIG. 12, the second example of the wiring electronic component shown in FIGS. 7(A) and 7(B) can be used similarly. The vertical wiring portions of the wiring electronic component are fixed to and electrically connected to the lead frame at predetermined locations by means of, for example, soldering or electrically conductive paste such as silver paste. In a state where the vertical wiring portions have been fixed to the lead frame at predetermined locations, all the vertical wiring portions are connected together by the support portion.

An LSI chip is bonded and connected to the lead frame. The LSI chip is bonded to a die pad of the lead frame by use of a die bond material such as Ag paste (chip die bond). Inner lead portions of the lead frame and the LSI chip are connected together by Au bonding wires (wire bond). The end surfaces of outer lead portions for electrically connecting the lead frame to a peripheral circuit can be exposed not only to the back face of the lead frame as illustrated, but also to the side face. A plurality of lead frames are simultaneously formed from a metal plate of a Cu alloy plated with Pd through chemical corrosion patterning (etching) work or press work. The plurality of simultaneously formed lead frames are cut into individual pieces in a later process. The lead frames are shown in a state in which they have been cut into individual pieces. However, in actuality, the lead frames in this production stage are still connected together.

After that, as in the case described previously with reference to FIGS. 4 and 5, resin sealing is performed, and the support portion is separated, whereby the vertical wiring portions are separated from one another. Subsequently, dicing is performed to obtain separated chips, which are completed products. As described above, the wiring electronic component which embodies the present invention can be incorporated into a lead-frame-type electronic device package.

Figure 13:
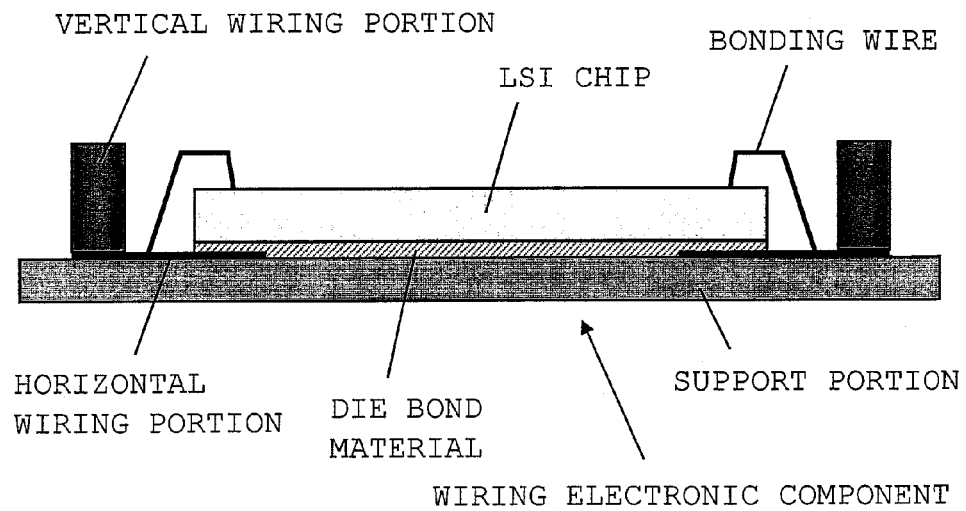
FIG. 13 is a view showing a state in which a circuit element (LSI chip) is mounted on a support portion of a wiring electronic component.

Next, there will be described manufacture of an electronic device package of a type in which an LSI chip is directly incorporated into a wiring electronic component configured on the basis of the present invention. FIG. 13 is a view showing a state in which a circuit element (the LSI chip) is mounted on and connected to the support portion of the wiring electronic component. The wiring electronic component used here corresponds to the wiring electronic component of the second example (see FIGS. 7(A) and 7(B) which has horizontal wiring portions in addition to vertical wiring portions. An electronic component including the LSI chip is boned to the horizontal wiring portion patterns of the wiring electronic component by use of a die bond material, and is connected to the horizontal wiring portion patterns by use of bonding wires (wire bond connection scheme). Alternatively, the electronic component can be mounted by a flip chip scheme. In this manner, the circuit element is disposed on the horizontal wiring portion patterns, and electrode terminals of the circuit element are electrically connected to the horizontal wiring portion patterns at desired locations.

Figure 14:
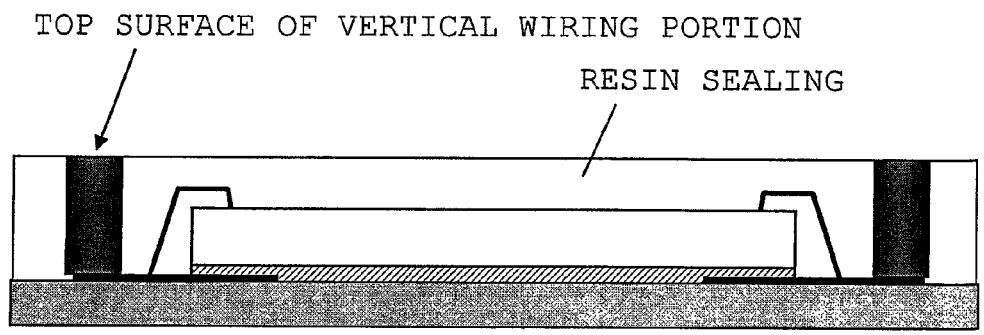
FIG. 14 is a view showing a state after performance of resin sealing.

FIG. 14 is a view showing a state after performance of resin sealing. The upper surface of the support portion is transfer-molded or resin-sealed by use of a liquid resin. The resin is charged up to a position corresponding to the upper surfaces of the vertical wiring portions by use of a die.

Figure 15:
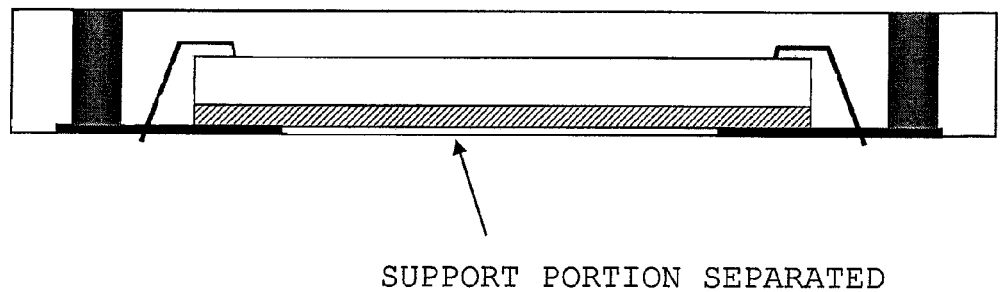
FIG. 15 is a view showing a state after separation of a support portion.

FIG. 15 is a view showing a state after separation of the support portion. The support portion, which is unnecessary in a completed product, is separated.

Figure 16:
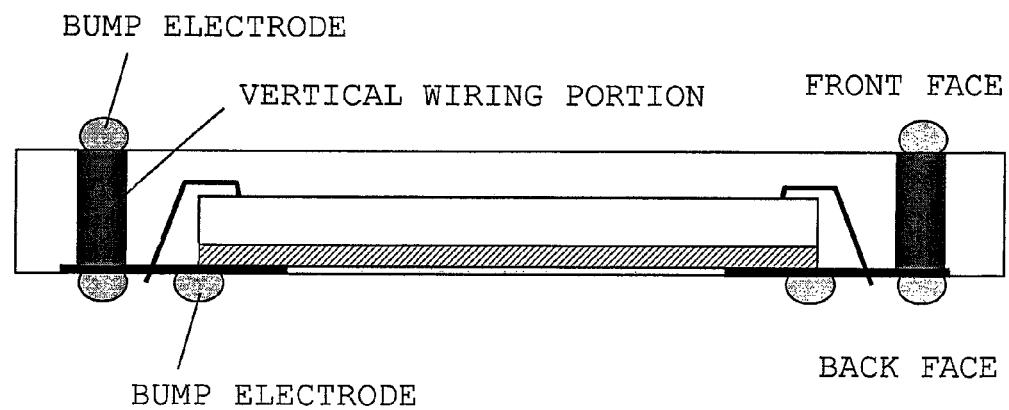
FIG. 16 is a view showing a state after formation of bump electrodes for external connection.

FIG. 16 is a view showing a state after formation of bump electrodes for external connection. On the front face, the bump electrodes are formed on the upper surfaces of the vertical wiring portions. On the back face, the bump electrodes are formed on the horizontal wiring portion patterns at predetermined locations. After that, dicing is performed to obtain separated chips, which are completed products.

Next, manufacture of a wafer level chip size package into which a wiring electronic component configured on the basis of the present invention is incorporated will be described with reference to FIGS. 17(A) to 21. A chip size package (CSP) refers to a micro-package whose size and thinness are close to those of an LSI chip. A wafer level chip size package (WLCSP) is known as a micro-package formed through a process in which, before a wafer is diced so as to separate LSIs from one another (dicing), each LSI and relevant electrodes are connected by use of wires, and the LSI is resin-molded; i.e., each LSI is directly packaged on the wafer.

Figure 17A:
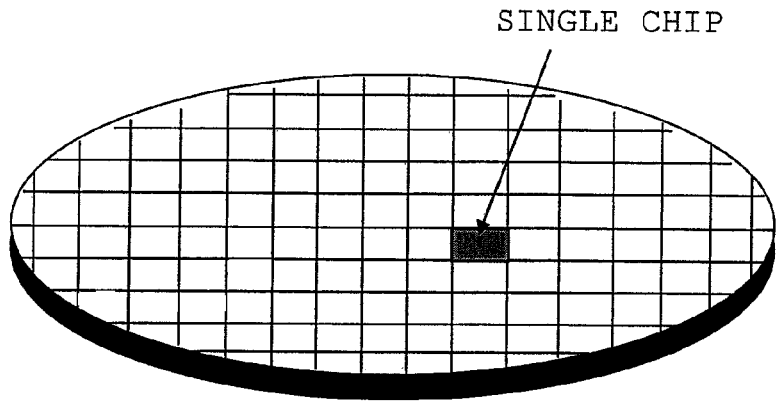
Figure 17B:
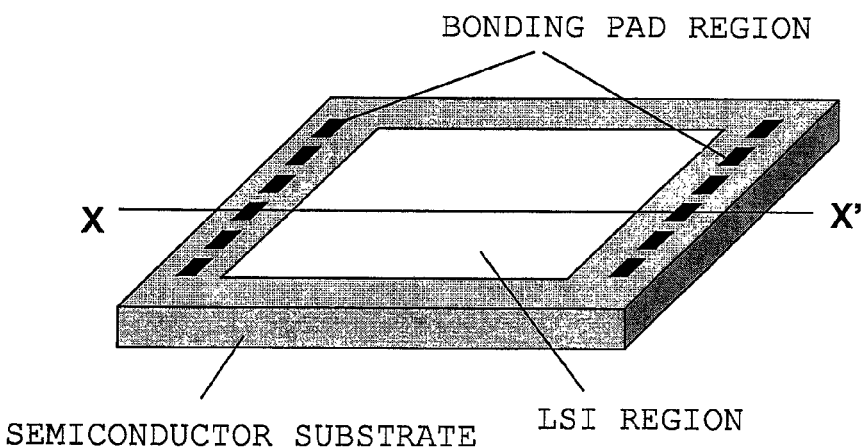
Figure 17C:
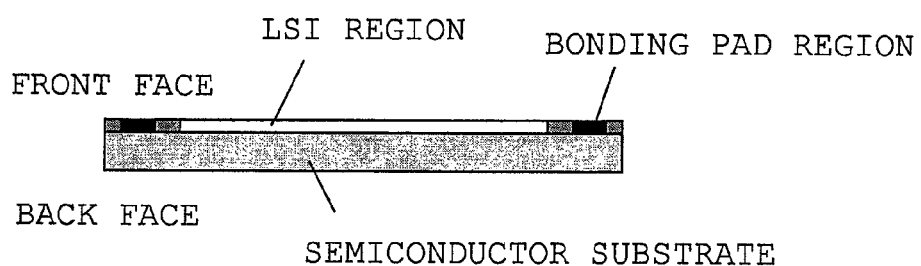

FIGS. 17(A) to 17(C) are views showing a completed LSI wafer, wherein FIG. 17(A) shows a single wafer on which a plurality of chips are formed in a matrix pattern, FIG. 17(B) is an enlarged LSI chip perspective view showing a single chip extracted from FIG. 17(A), and FIG. 17(C) is a cross-sectional view taken along line X-X'. The LSI chip shown in FIGS. 17(B) and 17(C) is formed on a semiconductor (e.g., silicon) substrate by use of an ordinary semiconductor process technique. An LSI region including an active region and a wring region is formed on the upper surface (front face) of the substrate, and bonding pad regions are formed around the LSI region. At the time of completion of manufacture of the wafer, the bonding pad regions are formed by aluminum wiring or copper wiring. Therefore, after completion of the wafer, barrier metal is applied to the bonding pad regions (e.g., gold sputtering or gold plating), and then plating, soldering, or the like is performed.

Figure 18:
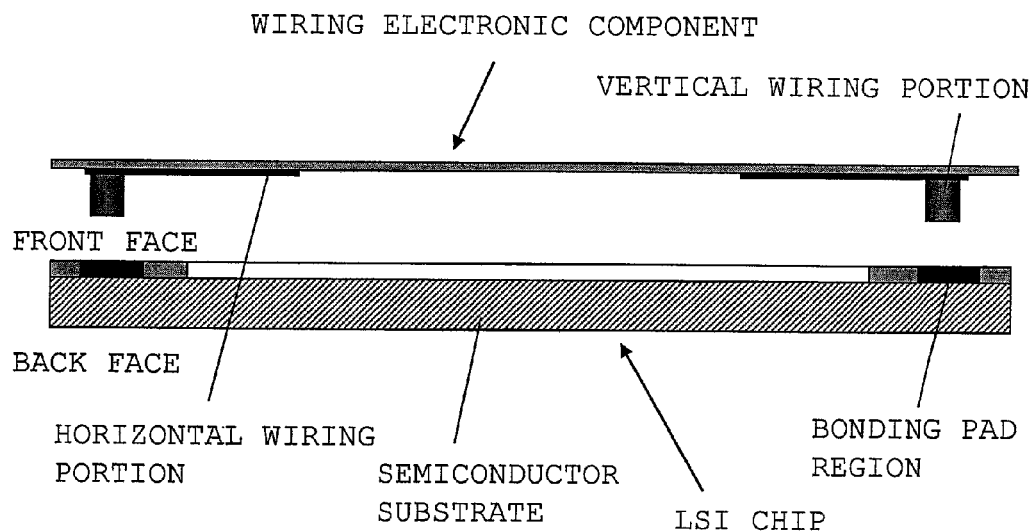
FIG. 18 is a view exemplifying a wiring electronic component and an LSI chip before being connected together.

FIG. 18 is a view exemplifying a wiring electronic component and an LSI chip before being connected together. In the illustrated example, the wiring electronic component of the second example which has horizontal wiring portions in addition to vertical wiring portions (see FIGS. 7(A) and 7(B)) is used. However, the wiring electronic component of the first example (see FIGS. 1(A) to 1(C)) can be used. The plurality of vertical wiring portions of the wiring electronic component are simultaneously fixed and electrically connected to the bonding pad regions on the LSI chip. The fixation and connection of the vertical wiring portions can be performed through soldering. The plurality of vertical wiring portions are simultaneously connected to the bonding pad regions by means of solder connection (e.g., solder reflow). In a state in which the vertical wiring portions have been fixed to the bonding pad regions, all the vertical wiring portions and wiring are connected together by the plate-shaped support portion.

Figure 19:
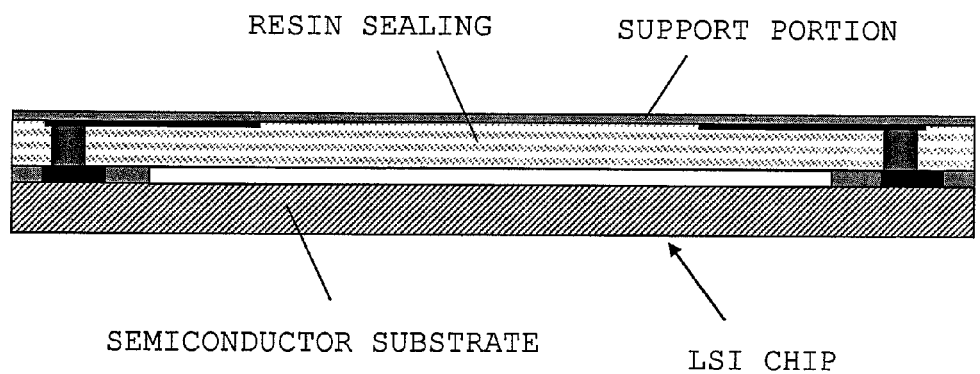
FIG. 19 is a view showing a state in which the wiring electronic component is connected and fixed to the LSI chip, and is then resin-sealed.

FIG. 19 is a view showing a state in which the wiring electronic component is connected and fixed to the LSI chip, and is then resin-sealed. After the vertical wiring portions connected together are fixed to the LSI chip, in this state, the front face of the LSI chip is transfer-molded, or resin-sealed by use of a liquid resin (e.g., epoxy resin), up to the lower surface of the support portion, so that the resin fills the apace between the LSI chip and the support portion.

Figure 20:
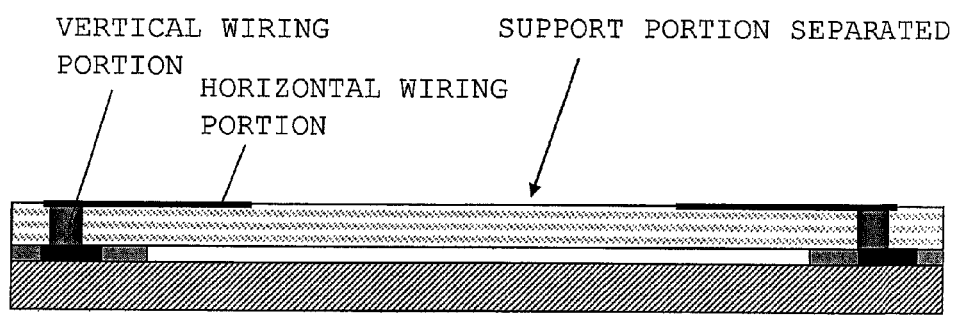
FIG. 20 is a view showing a state after separation of a support portion (electroforming mother die).

FIG. 20 is a view showing a state after separation of the support portion (electroforming mother die). As a result of separation of the support portion, the plurality of vertical wiring portions (and the horizontal wiring portions connected thereto) are electrically separated from one another.

Figure 21:
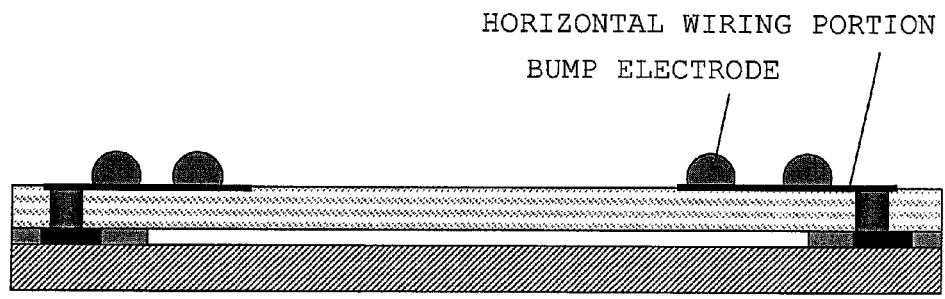
FIG. 21 is a view showing a state after formation of bump electrodes for external connection.

FIG. 21 is a view showing a state after formation of bump electrodes for external connection. On the horizontal wiring portion patterns exposed through separation of the support portion, bump electrodes for external connection are formed such that the bump electrodes are connected to the horizontal wiring portion patterns. As described above, processes of forming the vertical wiring portions and rewiring (horizontal wiring portions) of the wafer level chip size package can be put together in the form of a wiring electronic component.

Figure 22A:
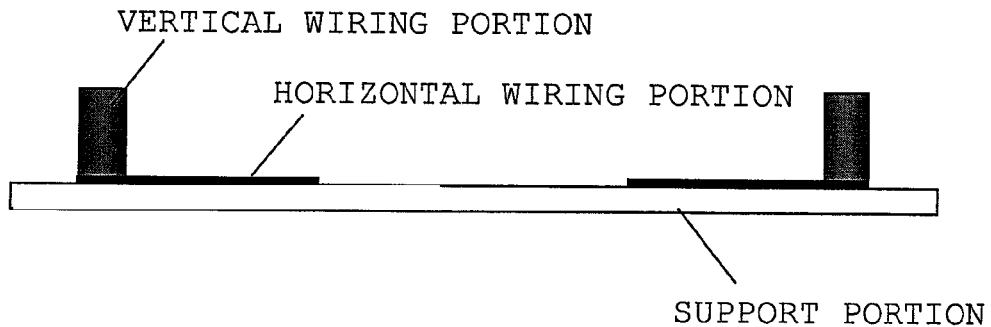
Figure 22B:
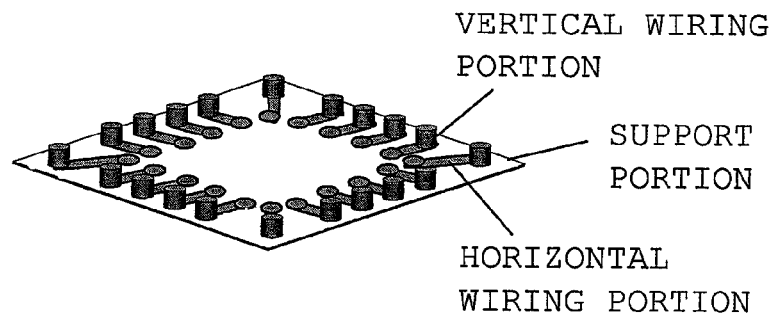
Figure 22C:
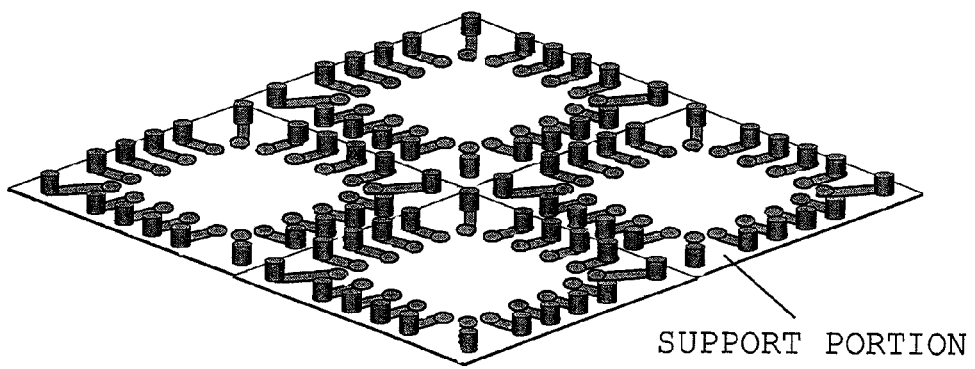

FIGS. 22(A) to 22(C) are views showing a third example of the wiring electronic component which embodies the present invention, wherein FIGS. 22(A) and 22(B) show a side cross-sectional view and a perspective view, respectively, of a unit structure, and FIG. 22(C) shows a perspective view of a structure in which four unit structures are connected together. This third example of the wiring electronic component is structurally identical with the second example (see FIGS. 7(A) and 7(B)), and has not only the vertical wiring portions supported by the support portion but also the horizontal wiring portion patterns connected thereto. However, unlike the second example in which the vertical wiring portions and the horizontal wiring portion patterns are formed through electroforming, in the third example, the vertical wiring portions and the horizontal wiring portion patterns are formed through plating.

This wiring electronic component is configured by means of integrally connecting the plurality of horizontal wiring portions and the plurality of vertical wiring portions via the support portion. The plate-shaped support portion can be formed from an insulation material in the form of a thin film such as polyimide tape. In the case where the insulation material must have a greater rigidity during manufacture of a semiconductor device, there can be used a two-layer structure in which a reinforcement plate (e.g., a stainless steel plate) is bonded to the back side (the side opposite the surface on which the horizontal wiring portions are formed) of the insulation material. This reinforcement plate is separated and removed after a resin sealing process to be described later.

As well known, when an electroless plating technique is used, supply of electricity as in the case of electroplating is not required. Therefore, plating can be performed for non-conductive materials such as plastic and ceramic. Irrespective of the shape and type of the material, a film having a uniform thickness can be obtained. Since the support portion of the wiring electronic component shown in this example functions as a protection film when manufacture of an electronic device package is completed, the support portion is not required to be separated and removed from the semiconductor device. In this case, formation of the horizontal wiring portion patterns and subsequent formation of the vertical wiring portions can be performed by means of plating.

Figure 23A:
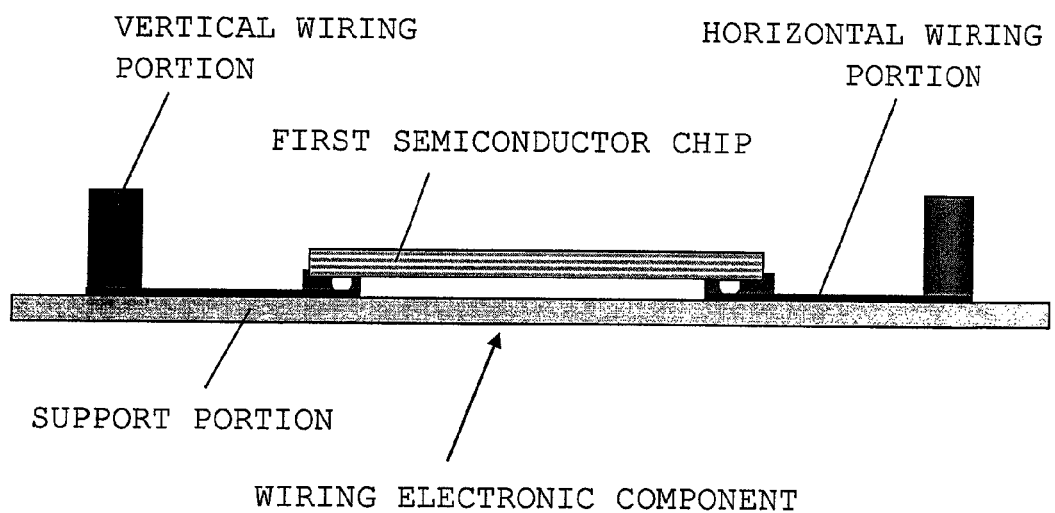
FIGS. 23(A) and 23(B) are a cross-sectional view and a perspective view, respectively, of the wiring electronic component of the third example to which a first semiconductor chip is connected.
Figure 23B:
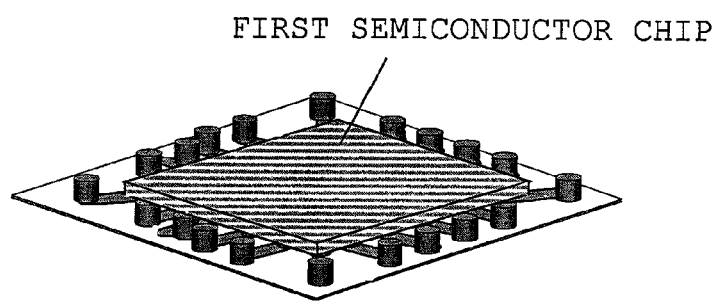

Next, manufacture of an electronic device package into which the wiring electronic component configured on the basis of the present invention and two semiconductor chips are incorporated will be described with reference to FIGS. 23(A) to 26. FIGS. 23(A) and 23(B) are a cross-sectional view and a perspective view, respectively, of the wiring electronic component of the third example to which the first semiconductor chip is connected. The first semiconductor chip is mounted on the horizontal wiring portion patterns supported by the support portion of the wiring electronic component, and is electrically connected to the horizontal wiring portion patterns by means of, for example, flip-chip-bond connection.

Figure 24:
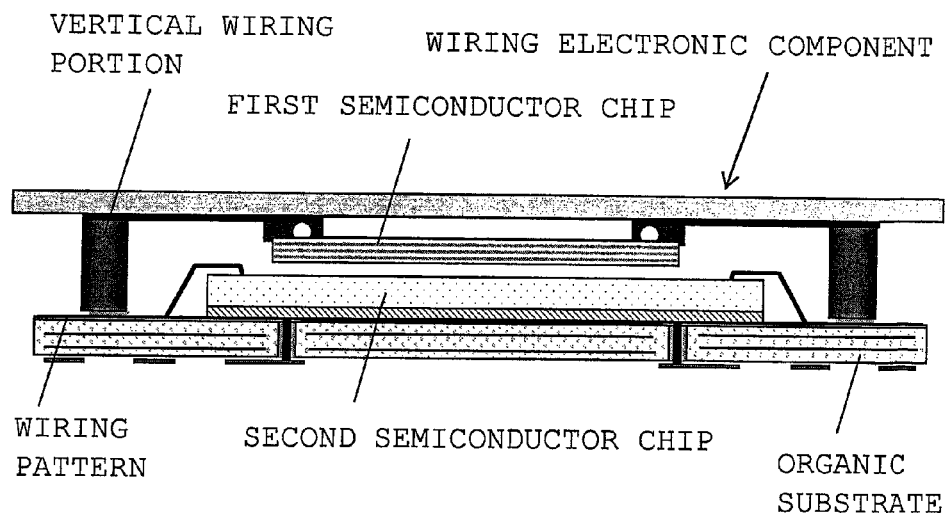
FIG. 24 is a view showing a state in which the wiring electronic component carrying the first semiconductor chip attached thereto is fixed and connected to an organic substrate carrying a second semiconductor chip attached thereto.

FIG. 24 is a view showing a state in which the wiring electronic component (see FIGS. 23(A) and 23(B)) carrying the first semiconductor chip attached thereto is fixed and connected to an organic substrate (see FIG. 2) carrying the second semiconductor chip attached thereto. The wiring electronic component carrying the first semiconductor chip attached thereto is fixed and electrically connected to a separately assembled organic substrate, such as the organic substrate previously described with reference to FIG. 2. The vertical wiring portions are fixed and electrically connected to the wiring patterns of the organic substrate at predetermined locations.

Figure 25:
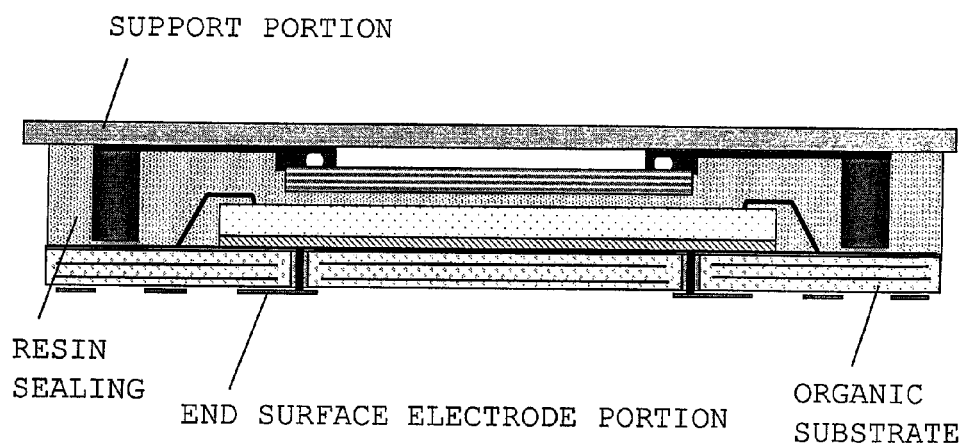
FIG. 25 is a view showing a state after performance of resin sealing.

FIG. 25 is a view showing a state after performance of resin sealing. After the vertical wiring portions connected together are fixed, in this state, the upper surface of the organic substrate is transfer-molded, or resin-sealed by use of a liquid resin (e.g., epoxy resin), up to the lower surface of the support portion.

Figure 26:
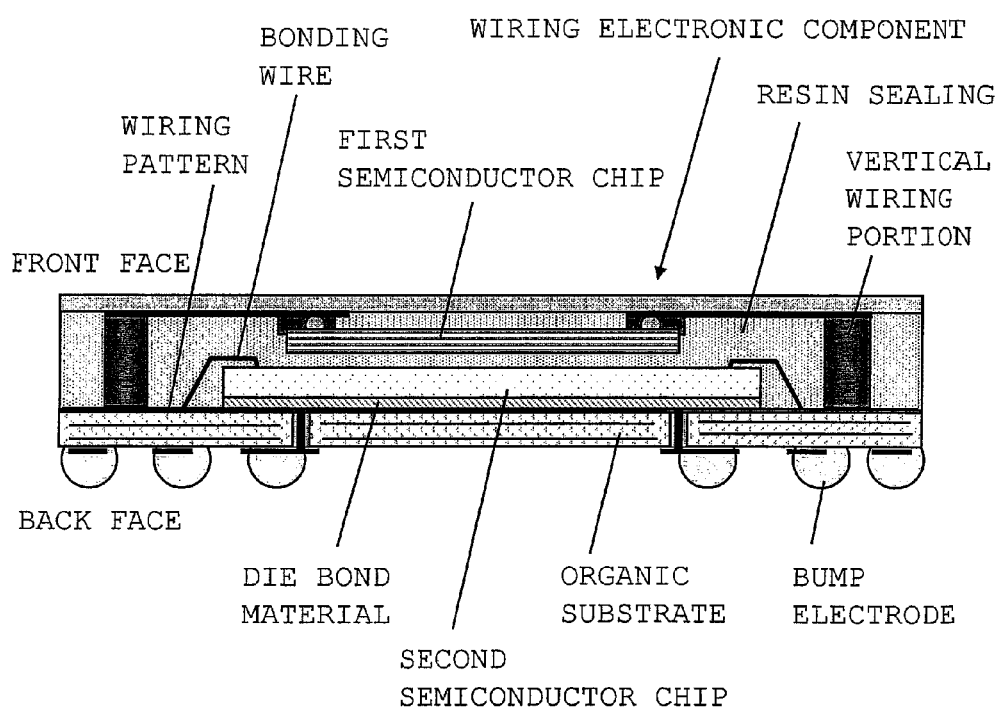
FIG. 26 is a view showing a state after formation of bump electrodes for external connection on end surface electrode portions (lands) formed on the back face side.

The structure obtained in this stage can be used as a completed product. The support portion functions as a protection film of the completed product. Notably, as shown in FIG. 26, bump electrodes for external connection may be subsequently formed on the end surface electrode portions (lands) formed on the back face side. Furthermore, dicing is performed to obtain separated chips, which are completed products.

Figure 27A:
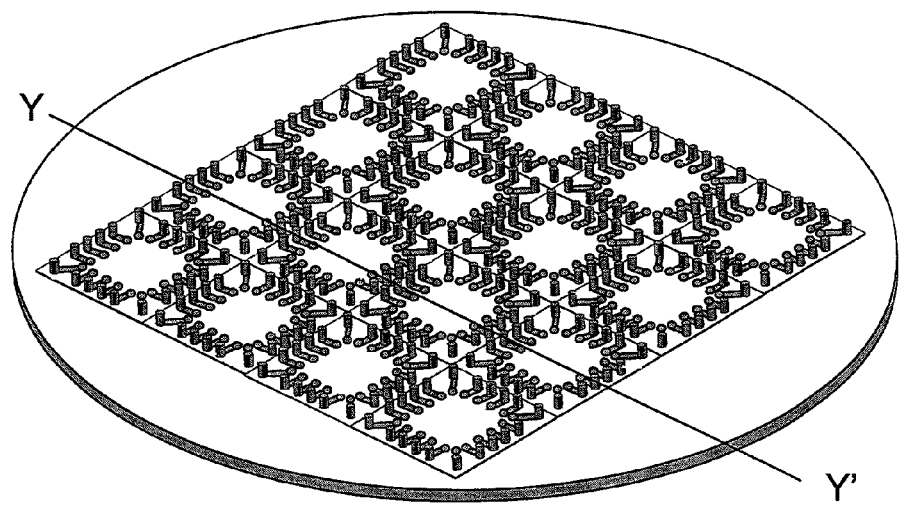
Figure 27B:
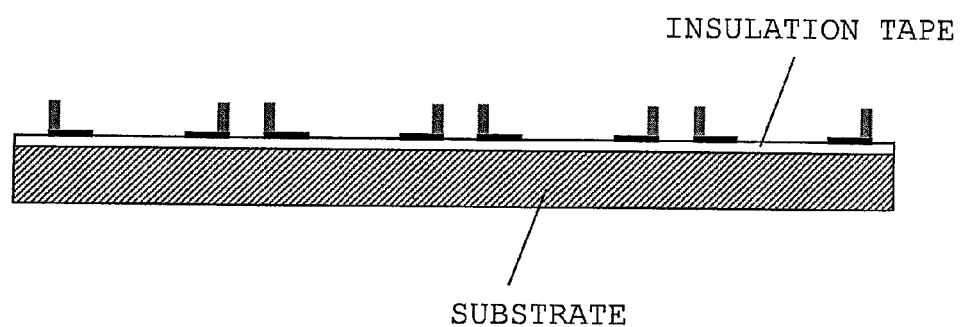
Figure 28:
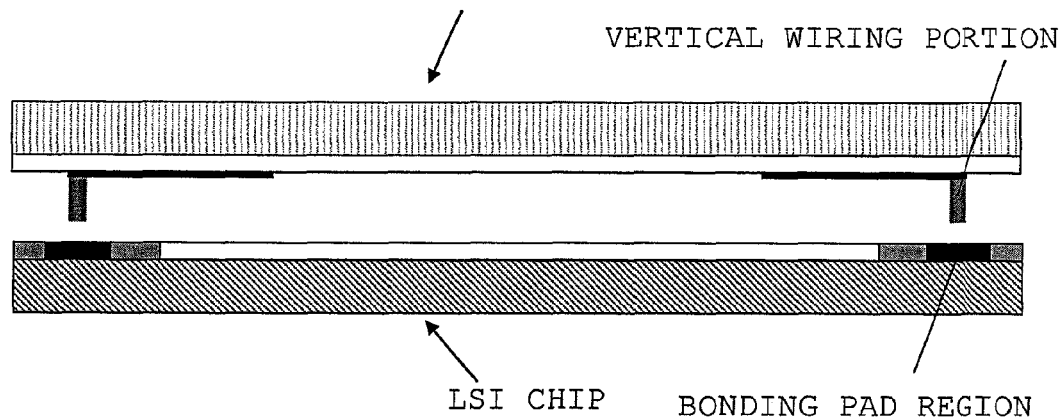
FIG. 28 is a view exemplifying a wiring electronic component and an LSI chip before being connected together.

FIGS. 27(A) and 27(B) are views showing a fourth example of the wiring electronic component which embodies the present invention, wherein FIG. 27(A) is a perspective view showing a plurality of wiring electronic components connected together, and FIG. 27(B) is a cross-sectional view taken along line Y-Y' in FIG. 27(A).

Stainless steel (SUS) can be used for the support portion. However, in the case where stainless steel is used, difference in coefficient of thermal expansion between the support portion and the silicon substrate may cause a positional shift between vertical-wiring-portion connection positions on the wafer and the positions of the vertical wiring portions supported by the stainless steel. In this case, desirably, a silicon substrate which is equal in thermal expansion to the above-mentioned silicon substrate or a glass substrate which is low in coefficient of thermal expansion is used. The illustrated support portion is formed by means of applying a tape over the entirety of one side of a substrate (stainless steel, silicon substrate, or glass). The tape is formed from an insulation material in the form of a thin film. A typical example of such tape is polyimide tape. The substrate and the tape are separated from each other in a later step. Therefore, a treatment is performed in advance which treatment facilitates separation between the substrate and the tape upon application of, for example, a temperature higher than reflow temperature (equal to or higher mold temperature). For example, adhesive containing thermal capsules is used. Alternatively, the support portion is formed of a light transmissible material (e.g., heat resistance glass which is low in thermal expansion), and an ultraviolet-ray-separation-type adhesive is used. Alternatively, a thermoplastic adhesive may be used.

Moreover, a metal seed layer which will become horizontal wiring portion patterns is formed on this tape, whereby a metal-clad tape is formed. The seed layer may be formed of foil of gold, silver, copper, or palladium, which can be copper-plated. The horizontal wiring portion patterns are formed through a process in which resist is applied to the seed layer, patterning is performed through exposure and development, etching is performed, and the resist is removed. A wiring layer is grown on this seed layer through plating. Furthermore, for formation of the vertical wiring portions, application of resist and development are carried out thereon, and post portions are grown through plating. Alternatively, the wiring portions may be formed by means of directly patterning the seed layer by use of nano-metal particles. In this case, the lithography step can be omitted. This direct patterning is a process of jetting in a desired pattern an organic solvent containing nano particles of metal such as copper by an ink jet method which is practically used in the field of printers. As in the above-described case, for formation of the vertical wiring portions, application of resist and development are carried out thereon, and post portions are grown through plating. Thus, the wiring electronic component is completed.

Next, manufacture of a wafer level chip size package which is configured by use of the fourth example of the wiring electronic component shown in FIGS. 27(A) and 27(B) will be described with reference to FIGS. 28 to 31. The wiring electronic component shown in FIG. 27 can be connected and fixed to the LSI chip described previously with reference to FIGS. 17(A) to 17(C), and FIG. 28 shows a state before the wiring electronic component is connected to the LSI chip. The vertical wiring portions of the wiring electronic component are fixed to and electrically connected to the bonding pad regions of the LSI chip.

Figure 29:
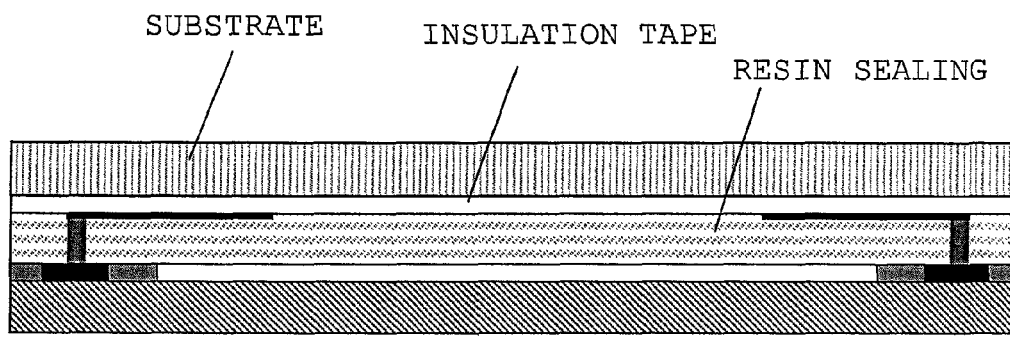
FIG. 29 is a state in which the wiring electronic component is connected and fixed to the LSI chip, and is then resin-sealed.

FIG. 29 is a state in which the wiring electronic component is connected and fixed to the LSI chip, and is then resin-sealed. After the vertical wiring portions connected together are fixed to the LSI chip, in this state, the upper surface of the LSI chip is transfer-molded, or resin-sealed by use of a liquid resin (e.g., epoxy resin), up to the lower surface of the insulation tape.

Figure 30:
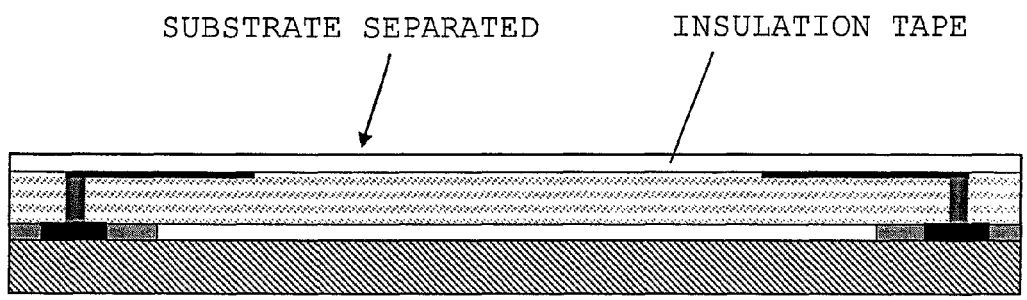
FIG. 30 is a view showing a state after separation of a substrate.

FIG. 30 is a view showing a state after separation of the substrate. For example, through application of a predetermined high temperature, the substrate (stainless steel, silicon substrate, or glass) is separated. The insulation tape exposed as a result of the separation functions as a protection film of a completed product.

Figure 31:
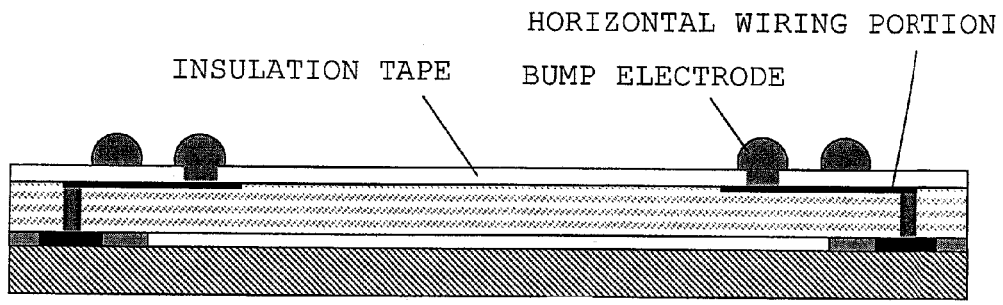
FIG. 31 is a view showing a state after formation of bump electrodes for external connection.

FIG. 31 is a view showing a state after formation of bump electrodes for external connection. Holes are formed in the insulation tape, and bump electrodes for external connection are formed thereon such that the bump electrodes are connected to portions of the wiring exposed as a result of formation of the holes. Thus, the wafer level chip size package is completed.

Figure 32A:
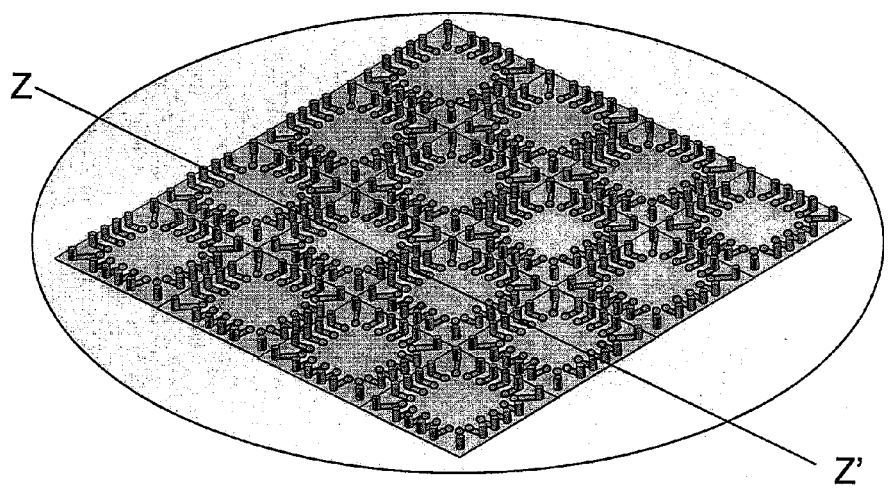
Figure 32B:
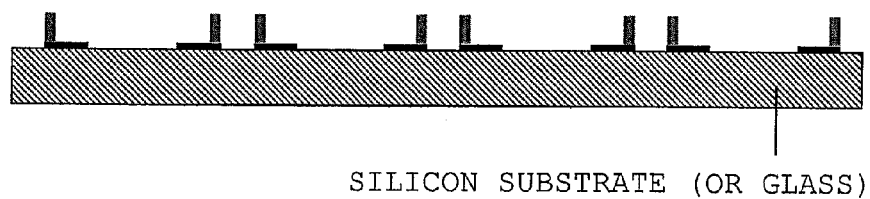
Figure 33:
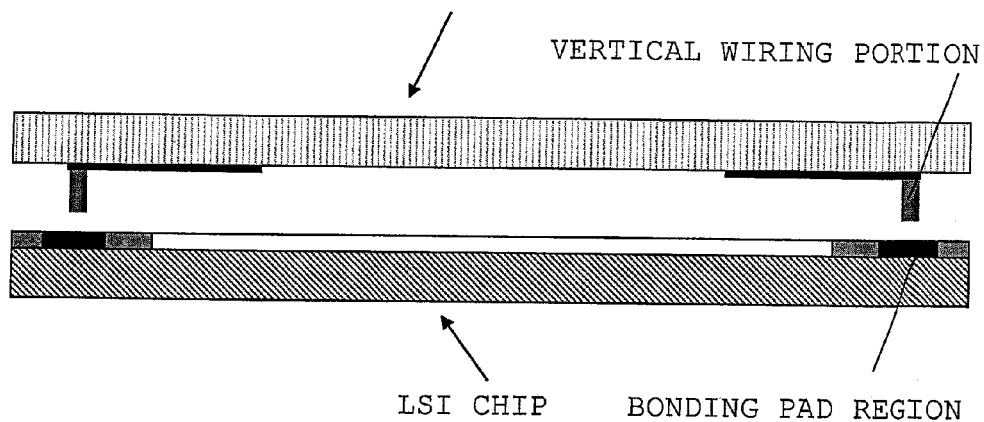
FIG. 33 is a view exemplifying a wiring electronic component and an LSI chip before being connected together.

FIGS. 32(A) and 32(B) are views showing a fifth example of the wiring electronic component which embodies the present invention, wherein FIG. 32(A) is a perspective view showing a plurality of wiring electronic components connected together, and FIG. 32(B) is a cross-sectional view taken along line Z-Z' in FIG. 32(A).

In this example, a silicon substrate or a glass substrate is used as a support portion. A separation assisting layer is provided on the silicon substrate, and a seed layer is then formed over the entire surface (through sputtering or application of nano metal material). The silicon substrate is separated from the wiring layer (the seed layer) in a later step. Therefore, a treatment is performed in advance which treatment facilitates separation between the silicon substrate (glass substrate) and the wiring layer upon application of, for example, a temperature higher than reflow temperature. Subsequently, resist is applied, development is performed so as to form a pattern corresponding to the horizontal wiring portions, and the horizontal wiring portions are grown through plating. As a result, the horizontal wiring portions are formed. Furthermore, application of resist and development for formation of the vertical wiring portions are carried out thereon, and the vertical wiring portions are grown through plating. Alternatively, the wiring and the vertical wiring portions may be directly patterned by use of nano-metal particles. Thus, the wiring electronic component is completed.

Next, manufacture of a wafer level chip size package which is configured by use of the fifth example of the wiring electronic component shown in FIGS. 32(A) and 32(B) will be described with reference to FIGS. 33 to 36. The wiring electronic component shown in FIG. 32 can be connected and fixed to the LSI chip described previously with reference to FIGS. 17(A) to 17(C), and FIG. 33 shows a state before the wiring electronic component is connected to the LSI chip. The plurality of vertical wiring portions of the wiring electronic component are simultaneously fixed to and electrically connected to the bonding pad regions of the LSI chip. Thus, the wiring electronic component is joined to the LSI chip.

Figure 34:
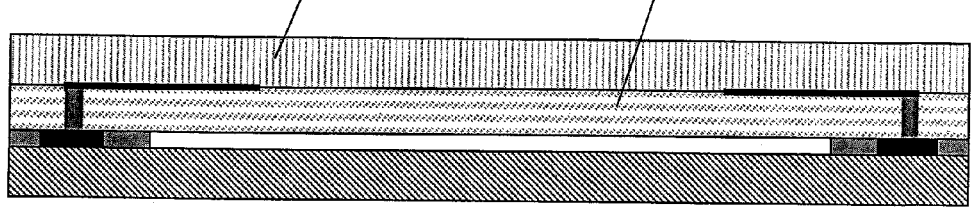
FIG. 34 is a state in which the wiring electronic component is connected and fixed to the LSI chip, and is then resin-sealed.

FIG. 34 is a state in which the wiring electronic component is connected and fixed to the LSI chip, and is then resin-sealed. After the vertical wiring portions connected together are fixed to the LSI chip, in this state, the upper surface of the LSI chip is transfer-molded, or resin-sealed by use of a liquid resin (e.g., epoxy resin), up to the lower surface of the silicon substrate (or glass substrate).

Figure 35:
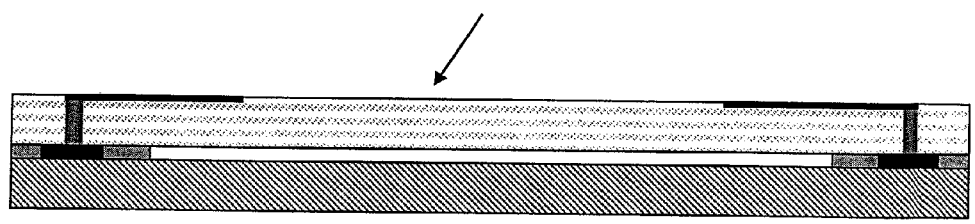
FIG. 35 is a view showing a state after separation of a silicon substrate (glass).

FIG. 35 is a view showing a state after separation of the silicon substrate (or the glass substrate). For example, through application of a predetermined high temperature, the silicon substrate (or the glass substrate) is separated.

Figure 36:
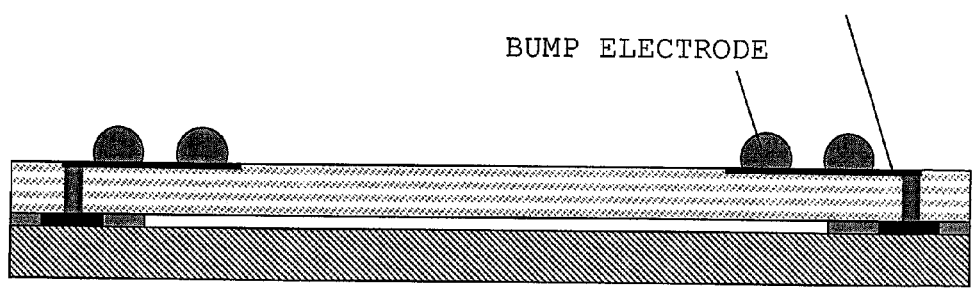
FIG. 36 is a view showing a state after formation of bump electrodes for external connection.

FIG. 36 is a view showing a state after formation of bump electrodes for external connection. Bump electrodes for external connection are formed such that the bump electrodes are connected to the wiring exposed as a result of separation of the silicon substrate (or the glass substrate). In the case where a protection film is formed so as to protect the top surface of the wiring, holes are formed in the protection film, and bump electrodes are formed on the holes. Thus, the wafer level chip size package is completed.

Figure 37:
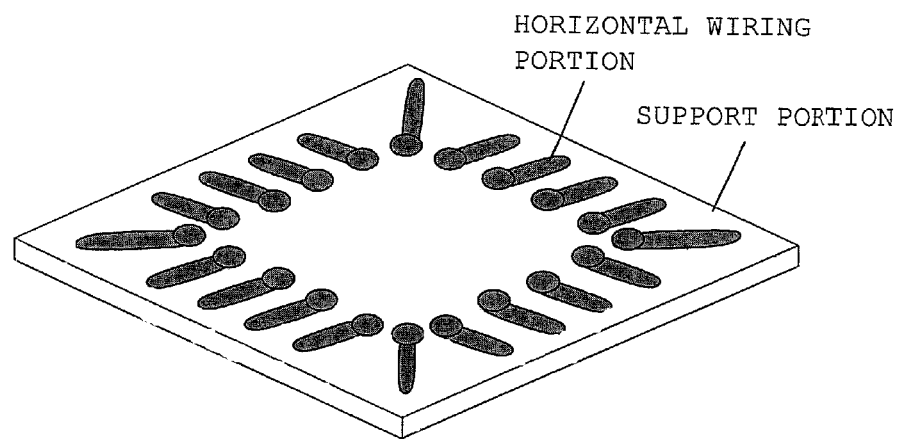
FIG. 37 is a view showing a state in which horizontal wiring portions are formed on a support portion in order to manufacture a sixth example of the wiring electronic component which embodies the present invention.

FIGS. 37 to 41 are views for explaining manufacture of a sixth example of the wiring electronic component which embodies the present invention. First, as shown in FIG. 37, horizontal wiring portions are formed on the support portion. In this case, in order to facilitate separation from the support portion in a later step, the horizontal wiring portions may be formed on the electrically conductive support portion through electroforming (single layer structure). Alternatively, the support portion may be formed of an insulation material in the form of a thin film such as polyimide tape (two-layer structure), and used as a protection film of a package into which the wiring electronic component is incorporated.

Figure 38:
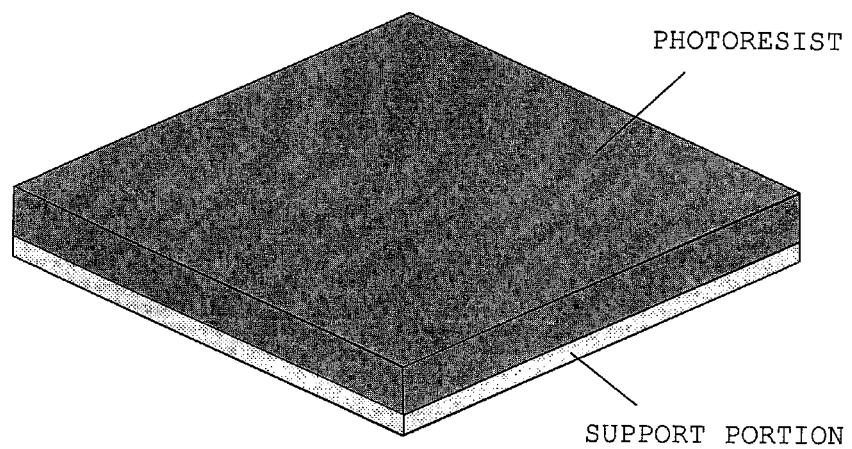
FIG. 38 is a view showing a state after application of photoresist onto the support portion.

Next, as shown in FIG. 38, photoresist is applied to the support portion, on which the horizontal wiring portions have been formed. Notably, in the illustrated example, the horizontal wiring portions are provided on the support portion. However, a method to be described below can be applied to manufacture of a wiring electronic component which has vertical wiring portions only and does not have horizontal wiring portions. In this case, photoresist is applied to the support portion on which no horizontal wiring portions are formed.

Figure 39:
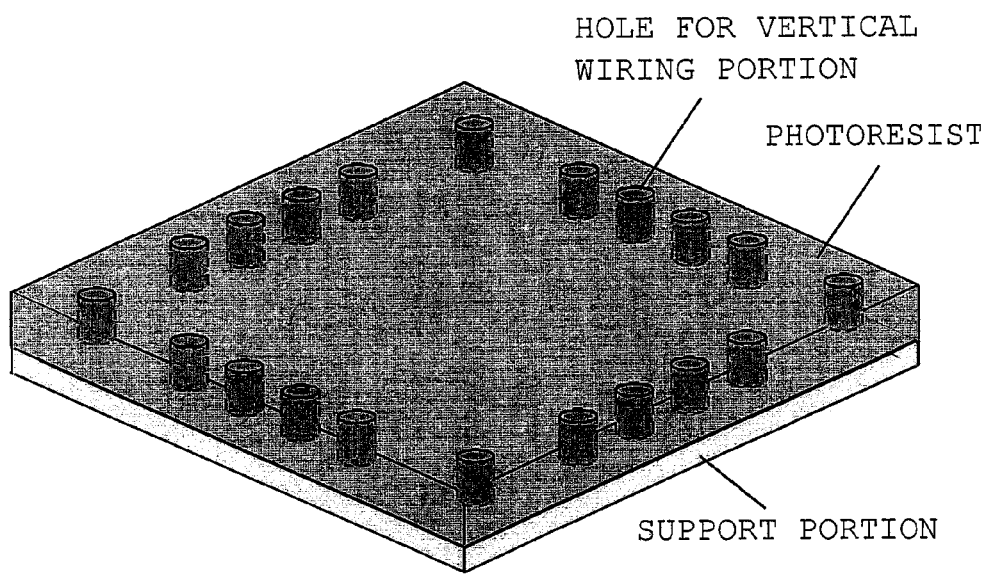
FIG. 39 is a view showing a state after formation of holes for vertical wiring portions.

Next, as shown in FIG. 39, holes for the vertical wiring portions are formed in the photoresist at positions at which the vertical wiring portions are to be formed. For formation of the holes, a vertical wiring portion pattern is transferred onto the photoresist and developed.

Figure 40:
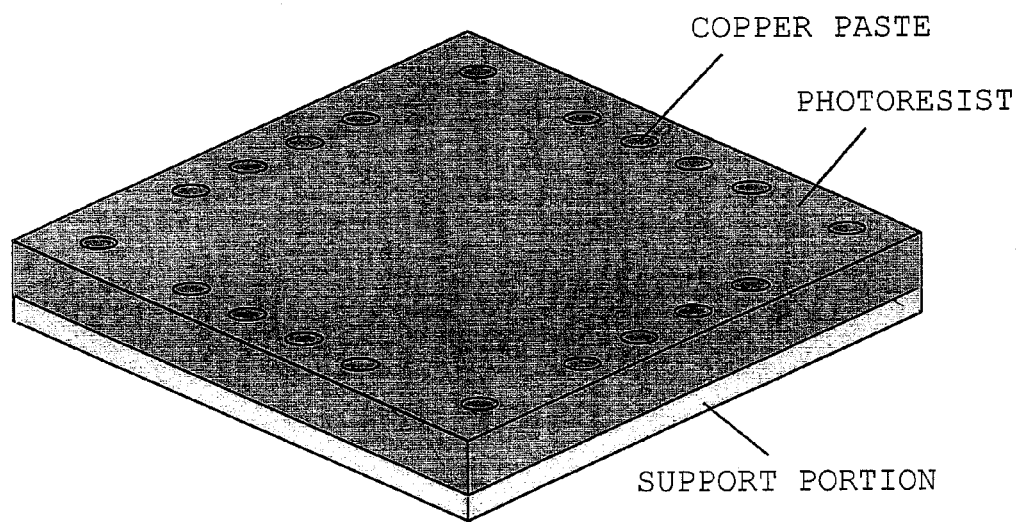
FIG. 40 is a view showing a state after copper paste is charged into the holes for vertical wiring portions.

Next, as shown in FIG. 40, copper paste is charged into the formed holes for the vertical wiring portions. This can be performed by use of a vacuum printing technique or an ordinary screen printing technique. Since the copper paste shrinks when it is baked or cured, the charging is performed in consideration of such shrinkage. For example, a resist material whose shrinkage is similar to that of the copper paste is used. Alternatively, the thickness of the resist film is determined in consideration of the amount of shrinkage.

Figure 41:
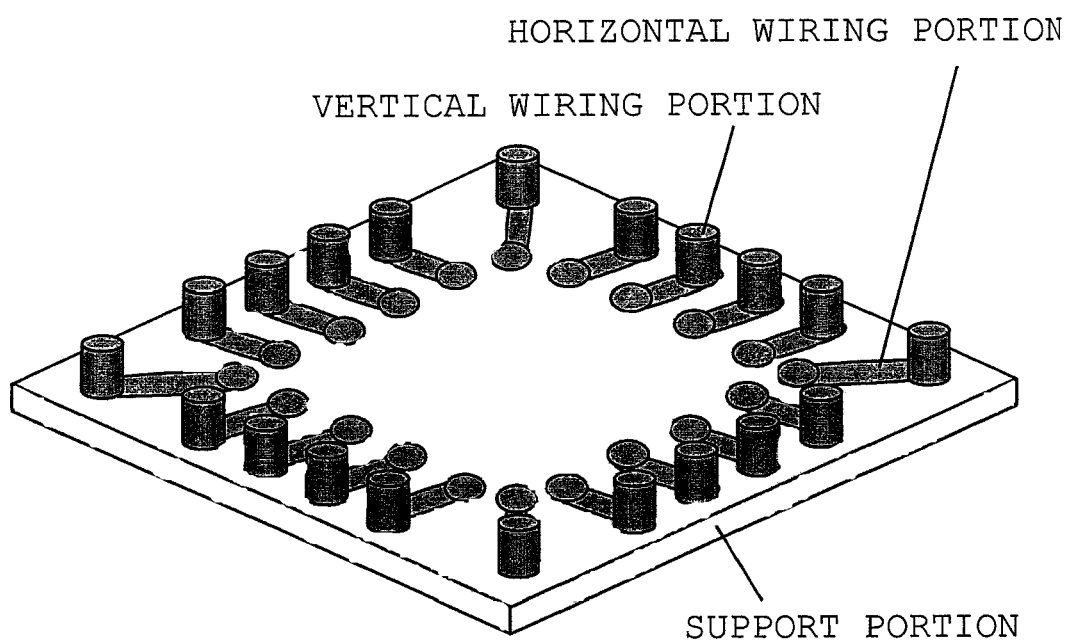
FIG. 41 is a view showing a state in which the sixth example of the wiring electronic component is completed through removal of photoresist.

Next, as shown in FIG. 41, the photoresist is removed, whereby the wiring electronic component is completed. In this case, columns formed of the copper paste can be used as the vertical wiring portions. However, if necessary, the circumferences of the columns are plated in order to reduce resistance and increase strength. The vertical wiring portions are reinforced by means of performing electroless plating or electroplating after removal of the resist.

Although only some exemplary embodiments of the present invention have been described in detail above, many modifications are possible in the exemplary embodiments without materially departing from the novel teachings and advantages of the present invention.

The invention claimed is:

1. A wiring electronic component to be incorporated into an electronic device package in which a circuit element is disposed therein, the circuit element including a semiconductor chip and the electronic device package including vertical wiring connected to the circuit element and external electrodes, the wiring electronic component comprising:
   a support portion having a two-layer structure, said two-layer structure having a reinforcement plate bonded to a back side of an insulation material via a separable adhesive; and
   a plurality of vertical wiring portions separably connected to the support portion so as to form the vertical wiring.

2. A wiring electronic component according to claim 1, wherein the plurality of vertical wiring portions are formed on the support portion by means of plating.

3. A wiring electronic component according to claim 2, wherein horizontal wiring portions connected to the vertical wiring portions are formed.

4. A wiring electronic component according to claim 3, wherein the support portion is formed by bonding a tape to the entirety of one side of a stainless steel plate, a silicon substrate, or a glass substrate, the tape being formed of the insulation material in the form of thin film.

5. A wiring electronic component according to claim 4, wherein a seed layer of metal is formed on the insulation material, and the vertical wiring portions and the horizontal wiring portions are grown on the seed layer through plating.

6. A wiring electronic component according to claim 3, wherein a stainless steel plate, a silicon substrate, or a glass substrate is used as the support portion, a seed layer is formed on the support portion via a separation assisting layer, and the vertical wiring portions and the horizontal wiring portions are grown on the seed layer through plating.

7. A wiring electronic component according to claim 1, wherein said reinforcement plate is connected to the semiconductor chip in a first state, said reinforcement plate being disconnected from the semiconductor chip in a second state, said insulation material being connected to one or more of said vertical wiring portions in the first state and the second state.

8. A wiring component according to claim 7, wherein said insulation material and the semiconductor chip define a space in a first wiring electronic component configuration, wherein resin fills said space such that said resin engages said insulation material in the second wiring electronic component configuration.

9. A method of manufacturing a wiring electronic component to be incorporated in an electronic device package in which a circuit element is disposed therein, the circuit element including a semiconductor chip and the electronic device package including external electrodes connected to the circuit element via vertical wiring, the method comprising:
   providing a support portion comprising a two-layer structure, said two-layer structure comprising reinforcement plate and insulation material, said reinforcement plate being bonded to a back side of the insulation material via a separable adhesive; and
   forming a plurality of vertical wiring portions for the vertical wiring through plating such that the vertical wiring portions are detachably connected to the support portion.

10. A method of manufacturing a wiring electronic component according to claim 9, wherein, after horizontal wiring portions are formed on the support portion, the vertical wiring portions to be connected to the horizontal wiring portions are formed.

11. A method of manufacturing a wiring electronic component according to claim 10, wherein a stainless steel plate, a silicon substrate, or a glass substrate is used as the support portion, a seed layer is formed on the support portion via a separation assisting layer, and the vertical wiring portions and the horizontal wiring portions are grown on the seed layer through plating.

12. A method of manufacturing a wiring electronic component according to claim 10, wherein the support portion is formed by bonding a tape to the entirety of one side of a stainless steel plate, a silicon substrate, or a glass substrate, the tape being formed of said insulation material in the form of thin film.

13. A method of manufacturing a wiring electronic component according to claim 12, wherein a seed layer of metal is formed on the insulation material, and the vertical wiring portions and the horizontal wiring portions are grown on the seed layer through plating.

14. A method of manufacturing a wiring electronic component according to claim 9, further comprising:
   connecting one or more of the vertical wiring portions to the semiconductor chip with each of the vertical wiring portions connected to the reinforcement plate;
   removing said reinforcement plate after said one or more of the vertical wiring portions is connected to the semiconductor chip such that said insulation material remains connected to the semiconductor chip and said one or more of the vertical wiring portions is disconnected from said reinforcement plate.

15. A method of manufacturing a wiring electronic component according to claim 14, further comprising:
   filling a space defined by at least the semiconductor chip and said insulation material with resin prior to removing said reinforcement plate, said resin engaging the semiconductor chip and said insulation material.

16. A method of manufacturing a wiring electronic component, the method comprising:
   providing a semiconductor chip;
   providing a support portion comprising a reinforcement plate, a separable adhesive and insulation material, said reinforcement plate being detachably connected to a rear side of said insulation material via said separable adhesive;
   forming a plurality of vertical wiring portions for vertical wiring via plating such that the vertical wiring portions are detachably connected to the support portion;
   connecting said support portion to said semiconductor chip, wherein each of said plurality of vertical wiring portions is connected to said semiconductor chip;
   removing said reinforcement plate from said insulation material with each of said plurality of vertical wiring portions connected to said semiconductor chip such that said reinforcement plate is disconnected from said insulation material and each of said plurality of said vertical wiring portions, wherein each of said wiring portions remains connected to said insulation material with said reinforcement plate removed from said insulation material.

17. A method of manufacturing a wiring electronic component according to claim 16, further comprising:
   filling a space defined by at least said semiconductor chip and said insulation material with resin prior to removing said reinforcement plate, said resin engaging the semiconductor chip and said insulation material.

18. A method of manufacturing a wiring electronic component according to claim 17, further comprising:

forming horizontal wiring portions, each of said horizontal wiring portions engaging one of said vertical wiring portions, said insulation material comprising another side opposite said rear side, each of said horizontal wiring portions engaging said another side, each of said horizontal wiring portions being connected to said semiconductor substrate via one of said vertical wiring portions.

* * * * *